(12) United States Patent
Kishita et al.

(10) Patent No.: US 9,620,394 B2
(45) Date of Patent: Apr. 11, 2017

(54) LIQUID TREATMENT APPARATUS

(71) Applicant: TOKYO ELECTRON LIMITED, Tokyo (JP)

(72) Inventors: Naofumi Kishita, Koshi (JP); Yuji Sakai, Koshi (JP)

(73) Assignee: Tokyo Electron Limited, Minato-ku (JP)

( * ) Notice: Subject to any disclaimer, the term of this patent is extended or adjusted under 35 U.S.C. 154(b) by 339 days.

(21) Appl. No.: 14/211,625

(22) Filed: Mar. 14, 2014

(65) Prior Publication Data

US 2014/0261163 A1  Sep. 18, 2014

(30) Foreign Application Priority Data

Mar. 18, 2013  (JP) .................... 2013-055605

(51) Int. Cl.
| | |
|---|---|
| B05C 11/08 | (2006.01) |
| H01L 21/67 | (2006.01) |
| H01L 21/687 | (2006.01) |
| G03F 7/16 | (2006.01) |

(52) U.S. Cl.
CPC ........ *H01L 21/67051* (2013.01); *B05C 11/08* (2013.01); *G03F 7/162* (2013.01); *H01L 21/68714* (2013.01); *H01L 21/68735* (2013.01); *H01L 21/68785* (2013.01)

(58) Field of Classification Search
CPC ... B05C 11/08; G03F 7/162; H01L 21/66051; H01L 21/68714; H01L 21/68735; H01L 21/68785
See application file for complete search history.

(56) References Cited

U.S. PATENT DOCUMENTS

| | | | | |
|---|---|---|---|---|
| 5,312,487 | A | 5/1994 | Akimoto et al. | |
| 5,677,000 | A * | 10/1997 | Yoshioka | ............ H01L 21/6715 |
| | | | | 118/52 |
| 6,159,288 | A * | 12/2000 | Satou | ...................... B05C 11/08 |
| | | | | 118/52 |

FOREIGN PATENT DOCUMENTS

| | | |
|---|---|---|
| JP | 08-117708 A1 | 5/1996 |
| JP | 09-117708 A1 | 5/1997 |
| JP | 2893146 B2 | 5/1999 |

OTHER PUBLICATIONS

Japanese Office Action (Application No. 2013-055605) dated May 26, 2015 (with machine translation).

* cited by examiner

*Primary Examiner* — Dah-Wei D Yuan
*Assistant Examiner* — Stephen Kitt
(74) *Attorney, Agent, or Firm* — Burr & Brown, PLLC

(57) ABSTRACT

In one embodiment, a cleaning member has an annular part and an opening positioned radially inside the annular part, and can be moved up and down between a first position and a second position relative to a cleaning nozzle. For cleaning of the back surface of the wafer, the cleaning member is placed at its first position that allows a cleaning liquid to reach the back surface of the substrate through the opening of the cleaning member. For cleaning of the cup structure, the cleaning member placed at its second position higher than the first position is being rotated, and a cleaning liquid discharged from the cleaning nozzle collides with an annular part of the cleaning member and is guided to the inner surface of a cup structure.

9 Claims, 15 Drawing Sheets

LIQUID TREATMENT APPARATUS

CROSS-REFERENCE TO RELATED APPLICATIONS

This application is based on and claims the benefit of priority from Japanese Patent Application No. 2013-055605 filed on Mar. 18, 2013, the entire contents of which are incorporated herein by reference.

BACKGROUND OF THE INVENTION

Field of the Invention

The present disclosure relates to a liquid treatment apparatus for performing a liquid treatment on a substrate held by a spin chuck.

Description of Related Art

In the process of forming a resist film, antireflection film, insulation film or the like on a semiconductor wafer (hereinafter referred to as a "wafer"), a liquid treatment for applying a treatment liquid (e.g., resist solution) on the surface of the wafer is conducted by supplying the treatment liquid to the wafer rotated by a spin chuck. To prevent the treatment liquid from scattering around, a cup structure is arranged to surround the spin chuck. The cup structure is periodically cleaned. A configuration for the cleaning of the cup structure is described in Japanese Patent No. 2893146 (Paragraphs 0022 and 0027, FIGS. 2, 3, 6, etc.), in which a cleaning jig is mounted on and rotated by a spin chuck and a cleaning liquid is supplied toward the rotated cleaning jig. In this configuration, the cleaning jig has to be conveyed to the spin chuck by a conveyance mechanism. Thus, no wafer can be conveyed by the conveyance mechanism when the conveyance mechanism is used for conveying the cleaning jig. Further, it is necessary to store the cleaning jig in a place accessible to the conveyance mechanism.

In the situation described above, the present inventors have investigated a configuration for installing the cleaning jig in the liquid treatment apparatus. A configuration as an example of such a liquid treatment apparatus has been proposed in JP-A-1996-117708 (Paragraphs 0022 and 0026-0028, FIGS. 1-5, etc.), in which a cup cleaning member is attached to the rotating shaft of substrate holding means. The cup cleaning member is supported by a base plate while treatment of the substrate (wafer) and back surface cleaning of the substrate are conducted. For the cleaning of the cup, the base plate is lowered till the cup cleaning member is received by and engaged with a rotation transmitting part formed on the rotating shaft, and the cup cleaning member is rotated by the rotating shaft. The base plate is equipped with a vertical back surface cleaning nozzle and a cleaning liquid supply nozzle. For the substrate back surface cleaning, the back surface cleaning nozzle is inserted into a through hole of the cup cleaning member to make the nozzle's tip end protrude from the cup cleaning member, and the cleaning liquid is supplied from the nozzle to the back surface of the wafer. For the cleaning of the cup cleaning member, the cleaning liquid supply nozzle supplies the cleaning liquid toward a cleaning liquid guiding part formed on the cup cleaning member.

In the configuration proposed by JP-A-1996-117708, however, the state in which the cup cleaning member is set on the base plate and the state in which the cup cleaning member is held up by the rotation transmitting part are created by use of the elevation (moving up and down) of the base plate as explained above. Therefore, the cup cleaning member might be displaced laterally due to the rotational vibration of the substrate holding means and the engagement of the cup cleaning member with the rotation transmitting part might become impossible. Further, since the cup cleaning member rotates in the state of being set on the rotation transmitting part having a smaller diameter than the substrate holding means, wobbling might occur during the rotation of the cup cleaning member together with the substrate holding means. There is another disadvantage in that height adjustment of the cup cleaning member is difficult even though it is sometimes necessary in the substrate back surface cleaning to adjust the height of the cup cleaning member in consideration of the cleaning liquid spattering from the cleaning member. Furthermore, while the substrate back surface cleaning is required to clean the peripheral area of the back surface of the substrate, there is anxiety that the cleaning of the back surface of the substrate cannot be performed efficiently since it is difficult for the back surface cleaning nozzle, as a vertical nozzle, to apply the cleaning liquid directly to the peripheral area.

SUMMARY OF THE INVENTION

In one embodiment of the present invention, there is provided a liquid treatment apparatus for performing a liquid treatment on a substrate by rotating the substrate with a substrate holding part located within a cup structure, which liquid treatment apparatus achieves good result of the substrate back surface cleaning and the cup structure cleaning.

In one embodiment of the present invention, there is provided a liquid treatment apparatus comprising a substrate holding part and a cup structure arranged around the substrate holding part, said liquid treatment apparatus being configured to perform a liquid treatment on a substrate by holding the substrate with a substrate holding part and by supplying a treatment liquid to a front surface of the substrate while rotating the substrate holding part around a vertical axis, said liquid treatment apparatus comprising: a cup cleaning nozzle that discharges a cleaning liquid for cleaning the cup structure; a substrate cleaning nozzle that discharges a cleaning liquid for cleaning a back surface of the substrate held by the substrate holding part; a cleaning member supported around a vertical axis, the cleaning member including an annular part formed in an annular shape extending along a circumferential direction of the cup structure and an opening positioned inside the annular part with respect to the radial direction of the cup structure; an elevation mechanism that moves the cleaning member up and down relative to the substrate cleaning nozzle and the cup cleaning nozzle between a first position and a second position higher than the first position; and a rotating mechanism for rotating, around the vertical axis, the cleaning member positioned at the second position, wherein the cleaning member positioned at the first position allows the cleaning liquid discharged from the substrate cleaning nozzle to reach the back surface of the substrate through the opening of the cleaning member, and the cleaning member positioned at the second position allows the cleaning liquid discharged from the cup cleaning nozzle to collide with the annular part of the cleaning member and to be guided to an inner surface of the cup structure.

In the foregoing embodiment, the liquid treatment apparatus employs the cleaning member supported around the vertical axis; the cleaning member is moved up and down relative to the substrate cleaning nozzle and the cup cleaning nozzle; and the cleaning member is configured to be capable of rotating at the height position for the cup structure cleaning (the cleaning member may also be capable of rotating at other height positions) and to perform the substrate back surface cleaning and the cup structure cleaning at height positions different from each other. Therefore, the back surface cleaning of the substrates and the cleaning of the cup structure can be conducted excellently.

In another embodiment, there is provided a liquid treatment apparatus comprising a substrate holding part and a cup structure arranged around the substrate holding part, said liquid treatment apparatus being configured to perform a liquid treatment on a substrate by holding the substrate with a substrate holding part and by supplying a treatment liquid to a front surface of the substrate while rotating the substrate holding part around a vertical axis, said liquid treatment apparatus comprising: a cup cleaning nozzle that discharges a cleaning liquid for cleaning the cup structure; a substrate cleaning nozzle that discharges a cleaning liquid for cleaning a back surface of the substrate held by the substrate holding part; a cleaning member mounted to a rotating shaft of the substrate holding part so as to position below the substrate holding part and above the cup cleaning nozzle and the substrate cleaning nozzle, the cleaning member has an outer edge positioned inside, with respect to a radial direction of the cup structure, an outer edge of the substrate held by the substrate holding part; wherein the cleaning liquid discharged from the substrate cleaning nozzle is supplied to the back surface of the substrate via a path outside the cleaning member, and the cleaning liquid discharged from the cup cleaning nozzle collides with the cleaning member to be guided to an inner surface of the cup structure.

DETAILED DESCRIPTION OF THE INVENTION

First Embodiment

Figure 1:
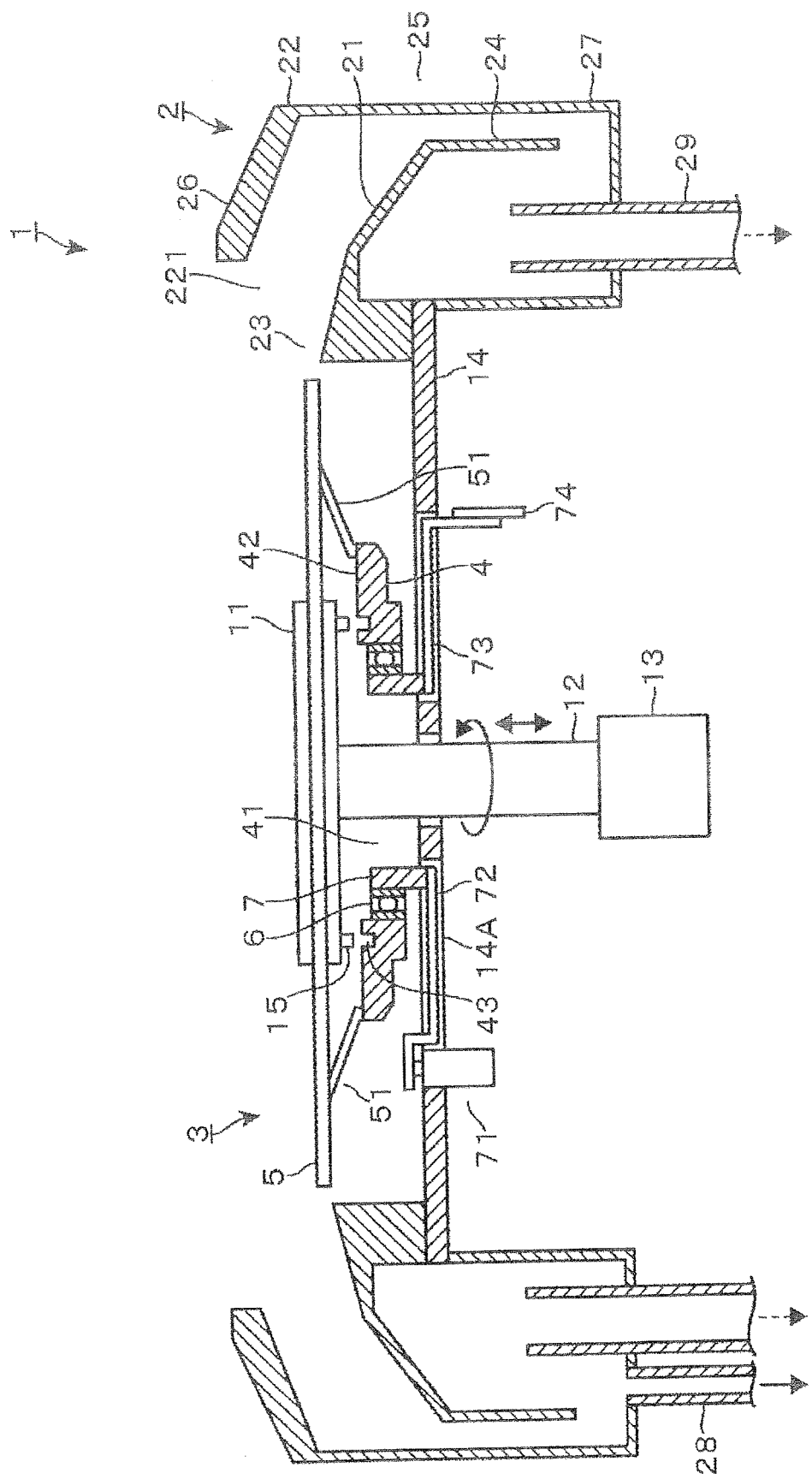
FIG. 1 is a vertical sectional side view showing a liquid treatment apparatus in a first embodiment of the present invention.

An embodiment of a liquid treatment apparatus, which is configured as a coating apparatus that preforms a liquid treatment for forming a resist film on a wafer by supplying a resist solution to the wafer, will be described below referring to FIGS. 1 to 7. The liquid treatment apparatus 1 is equipped with a spin chuck 11, serving as a substrate holding part, which holds the wafer W horizontally by vacuum-sucking the central part of the back surface of the wafer W. The spin chuck 11 is connected to a drive unit 13 via a shaft part 12 extending to the spin chuck 11 from below. The spin chuck 11 is configured to be freely moved up and down and rotated around a vertical axis by the drive unit 13. The drive unit 13 corresponds to the mechanism for rotating the spin chuck 11. Below the spin chuck 11, a circular plate 14 is arranged to surround the shaft part 12.

Around the spin chuck 11, a cup structure 2 is arranged to surround the spin chuck 11. The cup structure 2 receives liquid waste scattering around or dropping from the rotating wafer W. The cup structure 2 also serves to guide the liquid waste so as to discharge the liquid waste from the liquid treatment apparatus 1. The cup structure 2 includes an inner cup 21 and an outer cup 22. The inner cup 21, made of resin (e.g., tetrafluoroethylene), for example, is arranged in a ring-like shape around the circular plate 14. The inner cup 21 includes a ridge-shaped guide part 23 formed to have a ridge-like sectional shape and an annular vertical wall 24 extending downward from the peripheral edge of the ridge-shaped guide part 23.

The outer cup 22 is arranged to surround the outer surface of the inner cup 21. The outer cup 22 includes a vertical cylindrical part 25 and an inclined wall 26 extending obliquely inward and upward from the upper edge of the cylindrical part 25. The bottom of the cylindrical part 25 is formed in a concave shape as an annular liquid receiving part 27 arranged below the ridge-shaped guide part 23. A drainage line 28 is connected to the liquid receiving part 27 from below. Two air outlet pipes 29 are inserted into the liquid receiving part 27 from below at positions closer to the spin chuck 11 than the drainage line 28 so that gas and liquid are separated from each other by the side walls of the air outlet pipes 29. The cup structure 2 is configured so that the circular opening 221 of the outer cup 22 is larger than the wafer W and the ridge-shaped guide part 23 of the inner cup 21 is situated inside the circumferential part of the wafer W when the wafer W is held by the spin chuck 11 (see FIG. 5). Further, the cup structure 2 is configured so that the region between the inner cup 21 and the outer cup 22 is situated lateral to the wafer W held by the spin chuck 11 when a resist solution application process and a wafer back surface cleaning process are executed as will be explained later.

Figure 2:
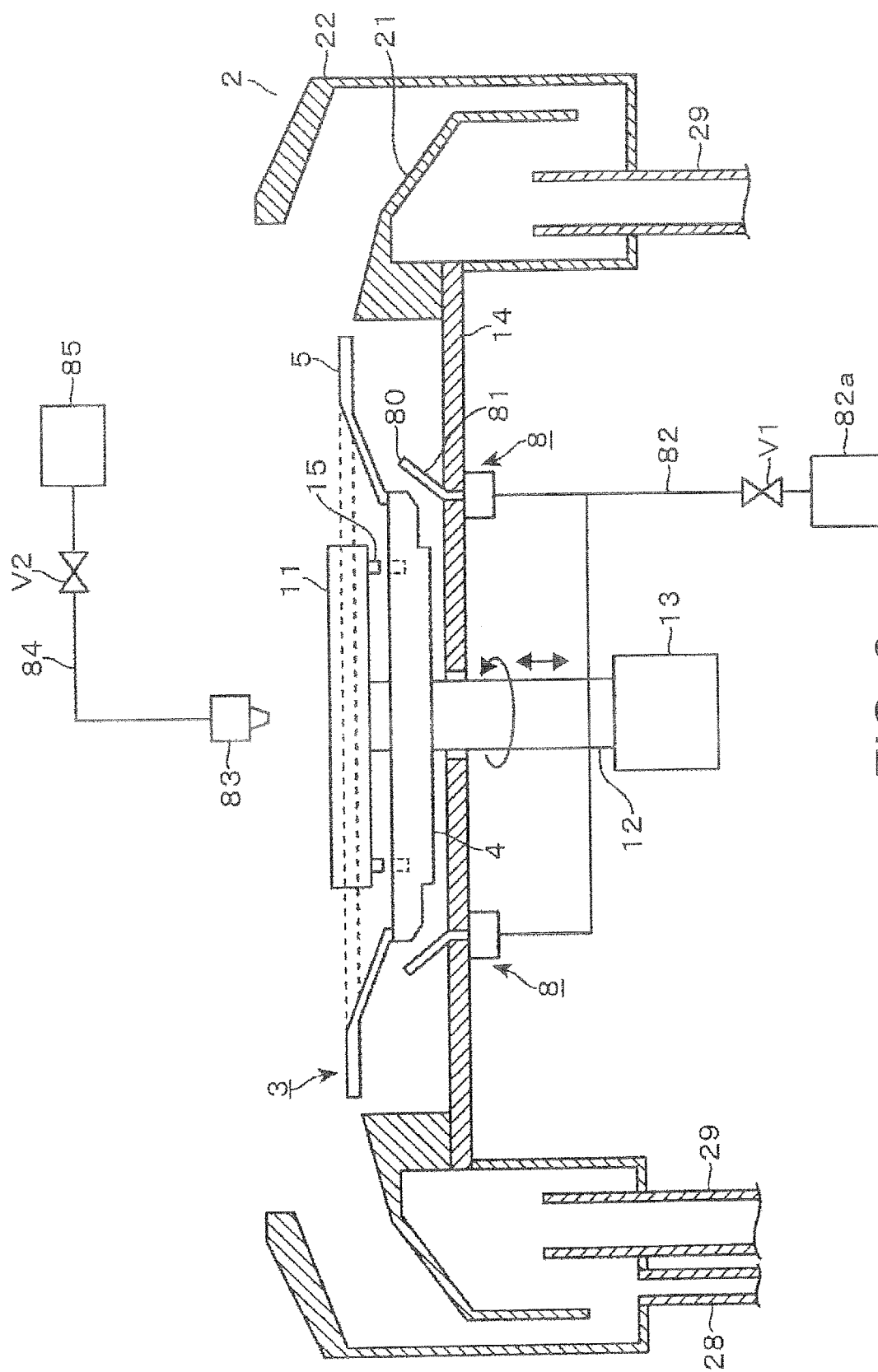
FIG. 2 is a vertical sectional side view showing the liquid treatment apparatus.
Figure 3:
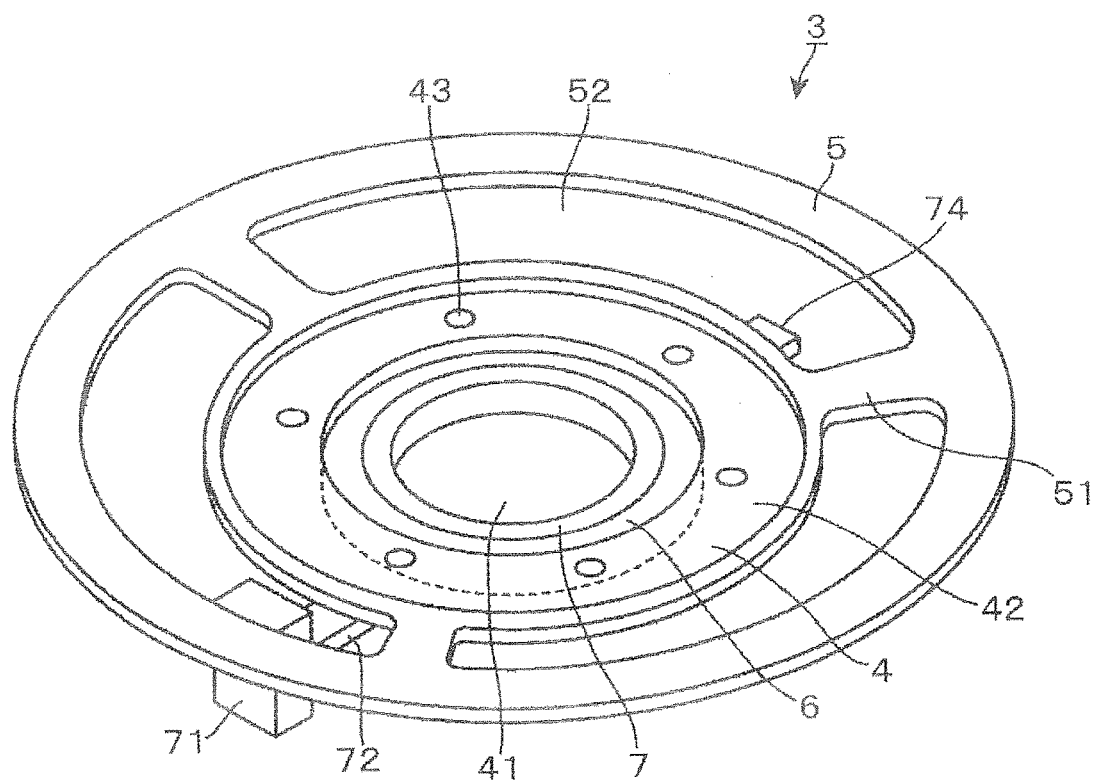
FIG. 3 is a perspective view showing an example of a cleaning member arranged in the liquid treatment apparatus.
Figure 4:
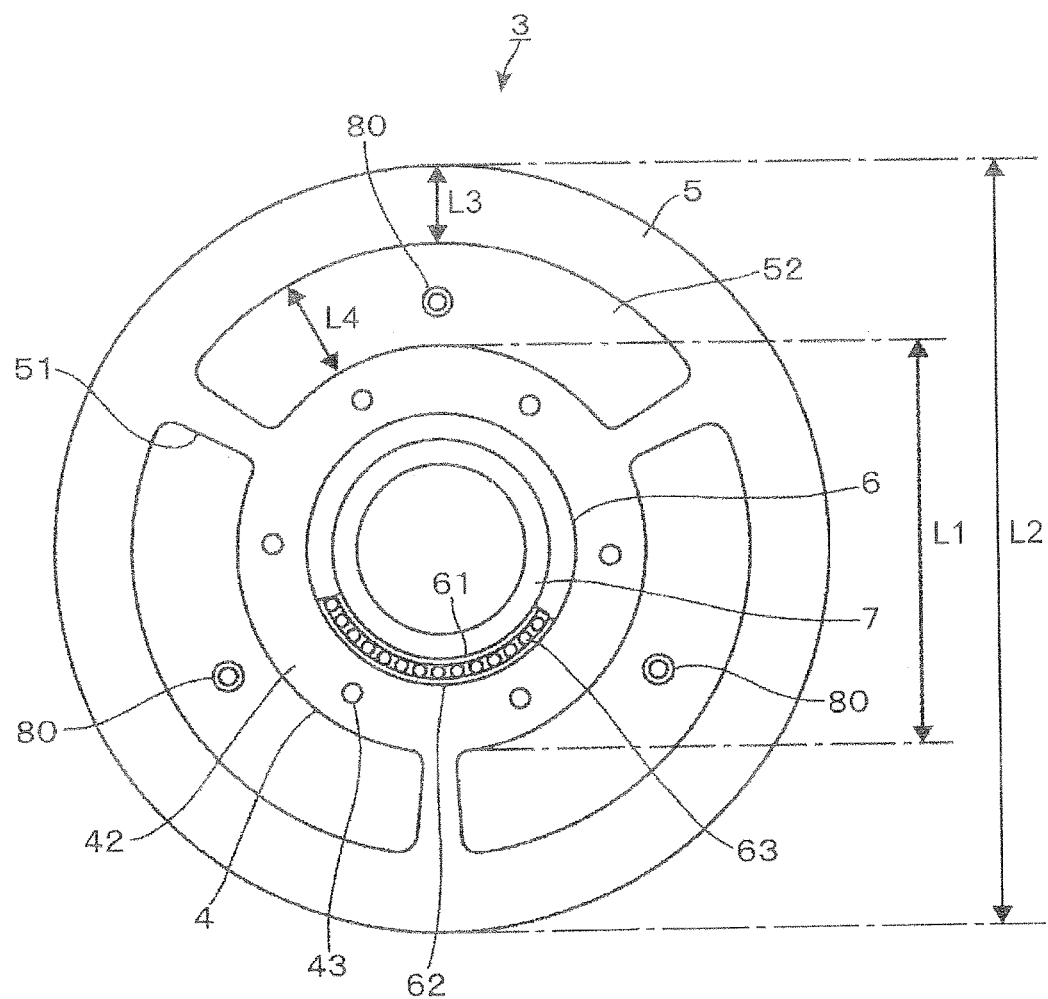
FIG. 4 is a schematic plan view showing the cleaning member.

A cleaning member 3 is arranged between the spin chuck 11 and the circular plate 14 as shown in FIGS. 1 and 2. As shown in FIGS. 3 and 4, the cleaning member 3 includes a central member 4 (in an annular shape in the plan view) which is arranged to surround the shaft part 12 of the spin chuck 11. The central member 4 is configured so that the shaft part 12 of the spin chuck 11 is inserted into an opening 41 at the center of the central member 4 and the upper surface 42 of the central member 4 faces the back surface of the spin chuck 11, for example. The central member 4 is designed so that the inner circumferential edge of the upper surface 42 is situated inside the outer circumferential edge of the spin chuck 11 and the outer circumferential edge of the upper surface 42 is situated outside the outer circumferential edge of the spin chuck 11, for example. A sectional view and a side view of the central member 4 are shown in FIGS. 1 and 2, respectively.

The cleaning member 3 includes an annular part 5 which is formed in an annular shape outside the central member 4 to extend along the circumference of the cup structure 2 and to surround the shaft part 12. The annular part 5 is arranged in order to have the cleaning liquid collide therewith and scatter toward the inner surface of the cup structure 2 (i.e., in order to guide the cleaning liquid to the inner surface of the cup structure 2) when the cup structure 2 is cleaned as will be explained later. Thus, the annular part 5 functions as a guiding part. The annular part 5 is connected to the peripheral part of the central member 4 by using connecting members 51. The central member 4, the connecting members 51 and the annular part 5 are formed of fluorine-based resin or surface-treated aluminum, for example. Each connecting member 51 is formed in a thin and substantially rectangular shape, for example. For instance, the connecting members 51 are arranged at three positions on the peripheral part of the central member 4 to extend outward in radial directions of the central member 4. One end of each connecting member 51 is connected to the central member 4, while the other end is connected to the annular part 5. Between the central member 4 and the annular part 5 connected as above, openings 52 situated inside (with respect to the radial direction of the cup structure 2) the annular part 5 are formed.

The cleaning member 3 is constantly supported around the vertical axis by a support member 7 (formed in a cylindrical shape, for example) via a bearing 6. For example, a ball bearing is used as the bearing 6 as schematically shown in FIG. 4. The inner ring 61 of the bearing 6 is connected to the support member 7, while the outer ring 62 of the bearing 6 is connected to the inner wall of the central member 4. The bearing 6 in this example is configured so that the inner ring 61 is fixed and balls 63 of the bearing 6 rotate when the outer ring 62 rotates. The height positions of upper surfaces of the bearing 6 and the support member 7 are set to be lower than the height position of the upper surface 42 of the central member 4. The central member 4, the annular part 5, the bearing 6 and the support member 7 are arranged on concentric circles differing in the diameter and centering at the rotational center of the shaft part 12.

A part of the lower end of the support member 7 is connected via an elevation plate 72 to an elevation mechanism 71 which moves the elevation plate 72 up and down. Another area of the lower end of the support member 7 is connected to a guide mechanism 74 via a guide plate 73. As above, the cleaning member 3 is connected to the elevation mechanism 71 via the bearing 6 to be rotatable around the vertical axis and to be freely elevated (moved up and down) by the elevation mechanism 71 between a first position and a second position higher than the first position. The first position is a height position where the cleaning member 3 separates from the spin chuck 11. The first position is set when the back surface cleaning of the wafer W (wafer back surface cleaning process) is performed. The second position is a height position where the cleaning member 3 approaches the spin chuck 11. The second position is set when the cleaning process for the cup structure 2 (cup structure cleaning process) is performed. When the cleaning member 3 is set at the second position, the region between the inner cup 21 and the outer cup 22 of the cup structure 2 is situated lateral to the annular part 5 of the cleaning member 3, for example. The circular plate 14 has opening areas formed for the elevation of the shaft part 12, the elevation plate 72 and the guide plate 73. Incidentally, FIG. 1 is drawn to indicate the elevation mechanism 71 and the guide mechanism 74, while FIG. 2 is drawn to indicate cleaning nozzles 8 which will be explained later.

On the back surface of the spin chuck 11, some (e.g., six) convex parts (or projections) 15 are formed at positions around the shaft part 12 and facing the upper surface 42 of the central member 4, at appropriate intervals in the circumferential direction around the shaft part 12. On the upper surface 42 of the central member 4, some (e.g., six) concave parts (or recesses) 43 are formed at positions corresponding to the convex parts 15. The convex parts 15 and the concave parts 43 are configured to engage with each other when the cleaning member 3 is set at the second position. The upper surface 42 of the central member 4 of the cleaning member 3 does not necessarily have to contact the back surface of the spin chuck 11 when the convex parts 15 engage with the concave parts 43.

Under the cleaning member 3, a plurality of cleaning nozzles 8 are arranged around the shaft part 12 at appropriate intervals in the circumferential direction as shown in FIGS. 2 and 4. In this example, three cleaning nozzles 8 are arranged at positions equally trisecting the circumference of a circle having the shaft part 12 as the rotational center, for instance. Each cleaning nozzle 8 includes a nozzle part 81 having a discharge port 80 at its tip end. The nozzle part 81 is configured so that the discharging direction of the cleaning liquid points obliquely upward and outward in the radial direction of the cup structure 2. The discharge ports 80 of the cleaning nozzles 8 are schematically shown in FIG. 4. The cleaning nozzles 8 are configured so that the cleaning liquid discharged from the cleaning nozzles 8 reaches the back surface of the wafer W (held by the spin chuck 11) through the openings 52 of the cleaning member 3 when the cleaning member 3 is at the first position.

Further, the cleaning nozzles 8 are configured so that the cleaning liquid discharged from the cleaning nozzles 8 collides with the annular part 5 and is guided to the inner surface of the cup structure 2 when the cleaning member 3 is at the second position. A solvent capable of dissolving the resist is used as the cleaning liquid, for example. The cleaning nozzles 8 are connected to a cleaning liquid supply source 82*a* via supply lines 82 equipped with a valve V1. The cleaning nozzles 8 in this example are used for two purposes, as cup cleaning nozzles for supplying the cleaning liquid for cleaning the cup structure 2 and as substrate cleaning nozzles for supplying the cleaning liquid for cleaning the back surface of the wafer W.

The liquid treatment apparatus 1 is further equipped with a resist nozzle 83. The resist nozzle 83 is connected to a resist supply source 85 via a supply line 84 equipped with a valve V2. The resist nozzle 83 is configured to be movable by a nozzle moving mechanism (not shown) between a treatment position over the wafer W and a standby position lateral to the cup structure 2.

An example of the dimensions of the cleaning member 3 is as follows: When the wafer W is of the 300 mm size, the diameter L1 (see FIG. 4) of the central member 4 is 200 mm, the external diameter L2 of the annular part 5 is 305 mm, the width L3 of the annular part 5 is 25 mm, and the width L4 of the opening is 30 mm, for example.

The operation of each part of the liquid treatment apparatus 1 is controlled by a control unit. The control unit includes a program storage unit, a CPU and a memory. The program storage unit includes one or more computer storage media such as a flexible disk, a compact disk, a hard disk, an MO (magneto-optical disk) and a memory card. A program stored in such a storage medium is installed in the control unit. The program includes commands (steps) for controlling the operation of each part of the liquid treatment apparatus 1 (by transmitting control signals thereto) and executing a resist solution application process (resist film formation process) which will be explained later, the wafer back surface cleaning process, and the cup structure cleaning process.

Next, the operation of the above-described liquid treatment apparatus 1 will be explained below referring to FIGS. 5 to 7. First, a wafer W is conveyed onto the spin chuck 11 and handed over to the spin chuck 11 by using a conveyance arm (not shown). Since the opening 221 of the outer cup 22 of the cup structure 2 is larger than the wafer W, the spin chuck 11 is elevated to a handover position higher than the outer cup 22, the handover of the wafer W from the conveyance arm to the spin chuck 11 is carried out at this position, and the wafer W is sucked and held by the spin chuck 11, for example.

Figure 5:
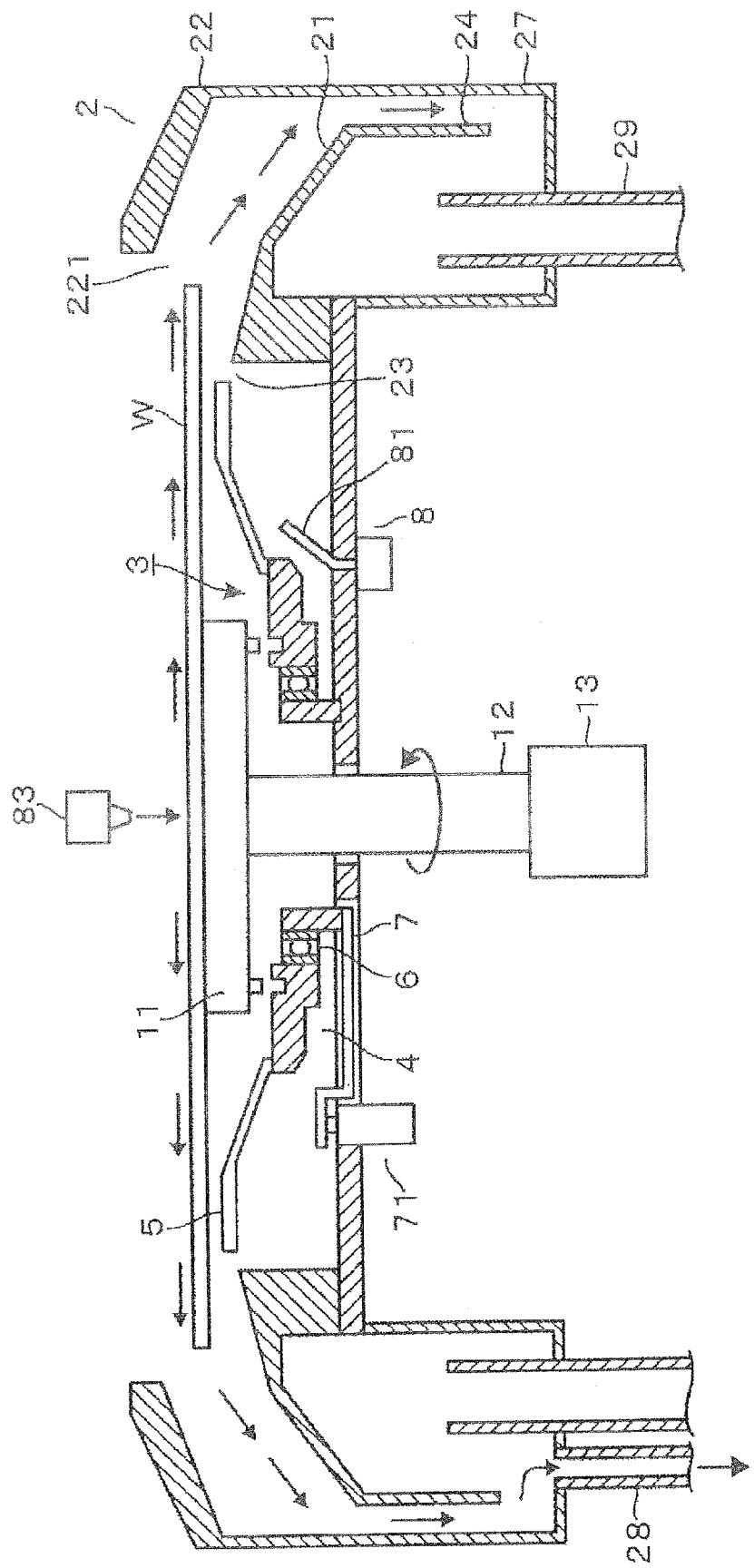
FIG. 5 is a vertical sectional side view showing how spin coating is performed by the liquid treatment apparatus.

Then, the resist solution application process (resist film formation process) is executed as shown in FIG. 5. In this application process, the resist nozzle 83 is moved from the standby position to the treatment position over the wafer W, the wafer W is spun at a prescribed revolution speed (e.g., 3000 rpm), and the resist solution is supplied from the resist nozzle 83 to the central part of the wafer W. The cleaning member 3 is previously set at the first position. The resist solution is spread toward the periphery of the wafer W by the centrifugal force (so-called "spin coating"). The wafer W is spun for a prescribed period. The solvent contained in the resist solution on the surface of the wafer W volatilizes, by which a resist film is formed. Unnecessary resist solution is scattered outward from the wafer W by the centrifugal force. The scattered resist solution flows, for example, from the region between the inner cup 21 and the outer cup 22 to the drainage line 28 via the liquid receiving part 27 and is drained. Part of the resist solution adheres to the ridge-shaped guide part 23 and the vertical wall 24 of the inner cup 21 and to the inner surfaces of the outer cup 22 and the liquid receiving part 27 and successively accumulates on the surfaces without draining away.

Figure 6:
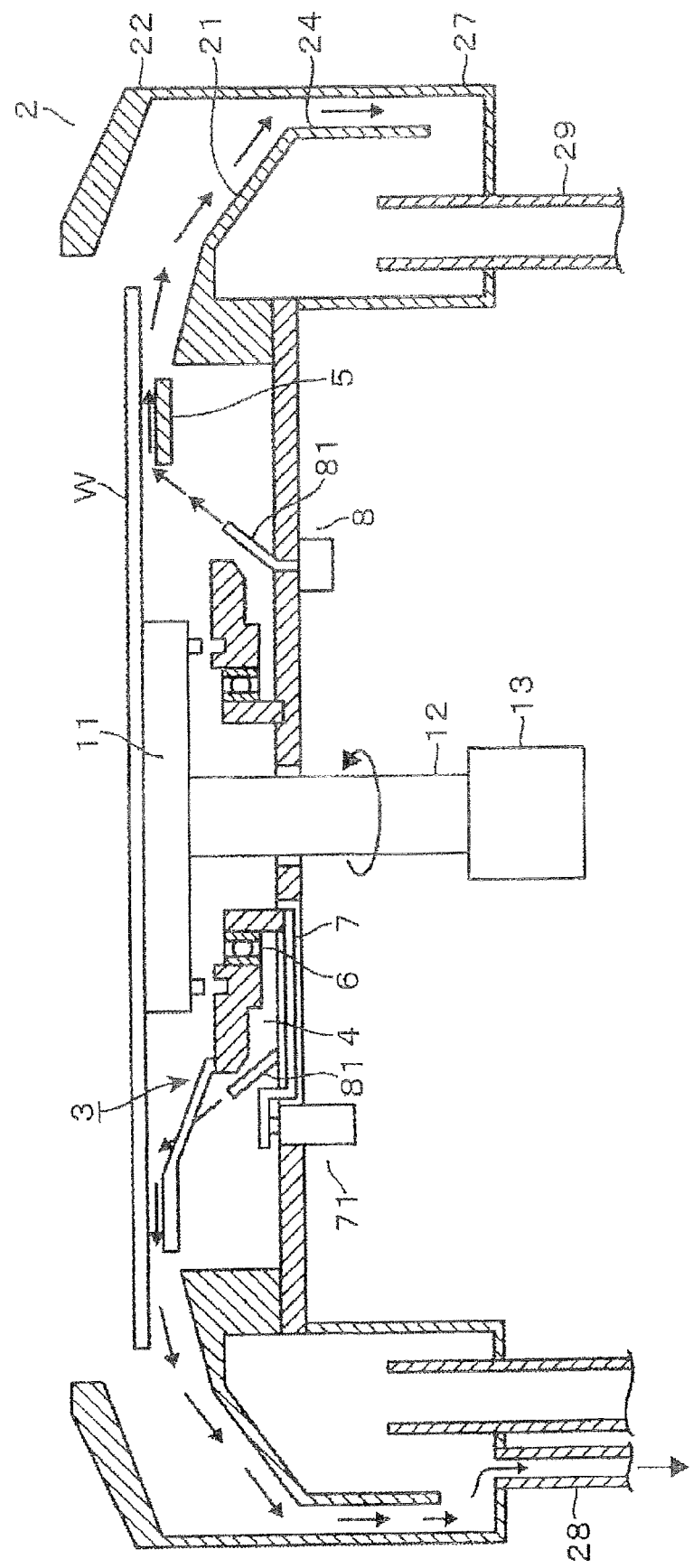
FIG. 6 is a vertical sectional side view showing how a wafer back surface cleaning process is performed by the liquid treatment apparatus.

After the resist solution application process (resist film formation process) is finished as above, the wafer back surface cleaning process is executed as shown in FIG. 6. In the back surface cleaning process, the wafer W is sucked and held by the spin chuck 11 and the cleaning member 3 is set at the first position. In this state, the cleaning liquid is discharged from the cleaning nozzles 8 while spinning the spin chuck 11 at a prescribed revolution speed (e.g., 1500 rpm). Since the openings 52 of the cleaning member 3 are formed to allow through the cleaning liquid discharged from the cleaning nozzles 8 when the cleaning member 3 is at the first position, the cleaning liquid reaches the back surface of the wafer W through the openings 52.

Further, since each cleaning nozzle 8 is configured so that the discharging direction of the cleaning liquid points obliquely upward and outward in the radial direction of the cup structure 2, the cleaning liquid reaches the peripheral area of the back surface of the wafer W (e.g., approximately 30 mm inside the outer circumference of the wafer W) even if the installation position of each cleaning nozzle 8 is inside the peripheral area of the wafer W in the radial direction of the cup structure 2. Furthermore, since the wafer W is spinning, the cleaning liquid flows to spread outward due to the centrifugal force of the spinning, gets scattered outward by the centrifugal force, and is collected by the cup structure 2. While the cleaning nozzles 8 are arranged at three positions to surround the shaft part 12, the cleaning liquid discharged from the cleaning nozzles 8 evenly covers the peripheral area of the back surface of the wafer W thanks to the spinning of the wafer W, and the resist adhering to the peripheral area of the back surface is dissolved and removed by the cleaning liquid. The resist scatters toward the cup structure 2 together with the cleaning liquid, flows to the liquid receiving part 27 via the region between the inner cup 21 and the outer cup 22, for example, and is drained via the drainage line 28.

Since the cleaning liquid scatters toward the cup structure 2 due to the centrifugal force as explained above, in the area of the inner surface of the cup structure 2 reached by the cleaning liquid, part of the resist adhering to the inner surface dissolves in the cleaning liquid, flows to the liquid receiving part 27 together with the cleaning liquid, and is drained. After the supply of the cleaning liquid to the wafer W being spun is continued for a prescribed period, the supply of the cleaning liquid is stopped and the spinning of the wafer W is continued, by which the cleaning liquid remaining on the back surface of the wafer W is vaporized and removed. After continuing the spinning for the removal of the cleaning liquid for a prescribed period, the spinning of the spin chuck 11 is stopped, the spin chuck 11 is elevated to the aforementioned handover position, and the wafer W is handed over to the conveyance arm (not shown).

Figure 7:
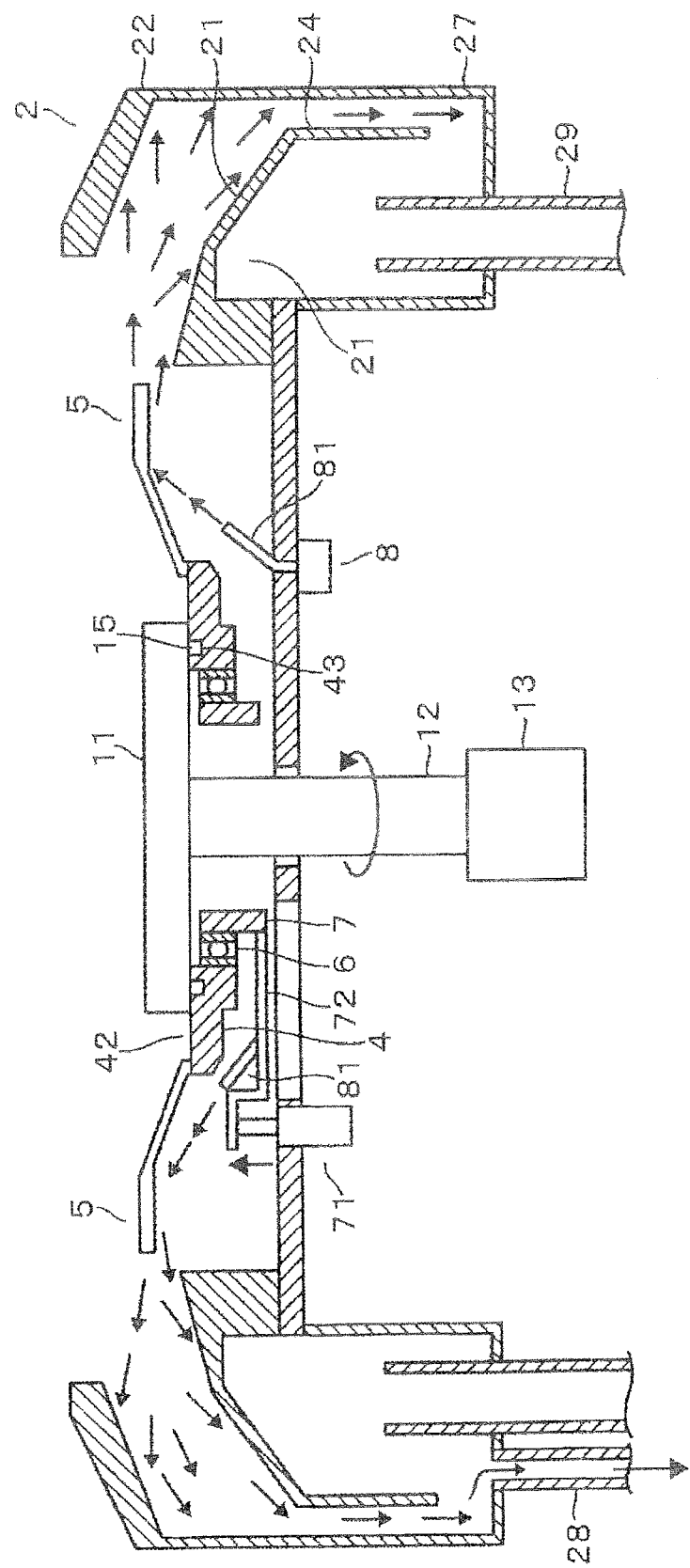
FIG. 7 is a vertical sectional side view showing how a cup structure cleaning process is performed by the liquid treatment apparatus.

After performing the resist solution application process and the wafer back surface cleaning process on all wafers W (included in a lot, for example) as explained above, the cup structure cleaning process is executed as shown in FIG. 7. In this cleaning process, the cleaning member 3 is elevated to the second position and the concave parts 43 of the cleaning member 3 are engaged with the convex parts 15 of the spin chuck 11. Subsequently, the cleaning liquid is discharged from the cleaning nozzles 8 while spinning the spin chuck 11 at a prescribed revolution speed (e.g., 1500 rpm). Since the cleaning member 3 has been engaged with the spin chuck 11, the torque of the shaft part 12 is transmitted to the central member 4 of the cleaning member 3 via the bearing 6, and the cleaning member 3 spins along with the spinning of the spin chuck 11. Further, since the upper surfaces of the bearing 6 and the support member 7 are set to be lower than the upper surface 42 of the central member 4, the bearing 6 and the support member 7 have no danger of contacting the back surface of the spin chuck 11 when the central member 4 spins. Consequently, the cleaning member 3 is allowed to spin smoothly.

When the cleaning member 3 is at the second position, the cleaning liquid discharged from the cleaning nozzles 8 collides with the annular part 5 of the cleaning member 3. Since the cleaning member 3 is spinning, the cleaning liquid colliding with the annular part 5 is guided outward by the centrifugal force of the spinning and is scattered around. The cleaning liquid scattered widely as above reaches large areas on the inner surface of the cup structure 2, such as the ridge-shaped guide part 23 and the vertical wall 24 of the inner cup 21 and the inner surfaces of the outer cup 22 and the liquid receiving part 27. The amount of the resist solution scattering from the wafer W in the resist solution application process is slight compared to the amount of the cleaning liquid scattering from the cleaning member 3 in the cup structure cleaning process. Further, the resist solution has higher viscosity than the cleaning liquid. Thus, the area on the cup structure 2 reached by the cleaning liquid in the cleaning process is larger than the resist-adhering area on the cup structure 2. Therefore, the cleaning liquid evenly reaches and covers the entire resist-adhering area on the cup structure 2. The resist accumulated on the inner surface of the cup structure 2 dissolves in the cleaning liquid, flows into the liquid receiving part 27 together with the cleaning liquid, and is drained. After continuing the spinning of the cleaning member 3 and the supply of the cleaning liquid for a prescribed period, the supply of the cleaning liquid is stopped and the spinning of the cleaning member 3 is continued, by which the cleaning liquid remaining on the cleaning member 3 is vaporized and removed. After continuing the spinning for the removal of the cleaning liquid for a prescribed period, the spinning of the spin chuck 11 is stopped. Thereafter, the cleaning member 3 is lowered to the first position.

In this embodiment, the cleaning member 3 supported around the vertical axis is employed and the cleaning member 3 is moved up and down relative to the cleaning nozzles 8. The cleaning member 3 is configured to be able to rotate (spin) at the height position for the cleaning of the cup structure 2 (second position), and to perform the back surface cleaning of the wafer W at the first position lower than the second position. For the back surface cleaning of the wafer W, the cleaning liquid is supplied to the back surface of the wafer W via the openings 52 formed through the cleaning member 3. For the cleaning of the cup structure 2, the cleaning member 3 is spun together with the spin chuck 11, and the cleaning liquid from the cleaning nozzles 8 is made to collide with the annular part 5 of the cleaning member 3 and is guided to the inside of the cup structure 2.

Therefore, the cleaning of the back surface of the wafer W and the cleaning of the cup structure 2 can be conducted without the need of using a cleaning member provided separately from the spin chuck 11. Since it is unnecessary to convey the cleaning member by using the conveyance mechanism (conveyance arm), the conveyance mechanism can be used exclusively for the treatment of the wafers W and the deterioration in the conveyance throughput can be suppressed. Further, downsizing of the apparatus can be achieved since it is unnecessary to secure a storage room for storing the cleaning member in the apparatus.

Since the cleaning member 3 supported around the vertical axis is employed and the cleaning member 3 set at the second position is spun by the drive unit 13 as the mechanism for rotating the spin chuck 11, the cleaning member 3 spins stably at the second position and the occurrence of wobbling is suppressed. Further, the cleaning member 3 is configured to be movable by the elevation mechanism 71 up and down relative to the cleaning nozzles 8. Thus, in the wafer back surface cleaning, the height of the cleaning member 3 can be finely adjusted in order to reduce the rebound or the like of the cleaning liquid from the cleaning member 3. Since the cleaning nozzles 8 are arranged below the cleaning member 3, the shapes and positions of arrangement of the cleaning nozzles 8 can be selected freely, without being restricted by the cleaning member 3. Therefore, it is possible to configure the cleaning nozzles 8 to directly supply the cleaning liquid to the peripheral area of the back surface of the wafer W in the wafer back surface cleaning, for example. In the cup structure cleaning, the cleaning liquid is made to collide with the annular part 5 of the cleaning member 3. Thus, when the cleaning member 3 is spun, the cleaning liquid consistently collides with the annular part 5 and is securely guided toward the annular cup structure 2. As a result, the back surface cleaning of the wafers W and the cleaning of the cup structure 2 can be carried out excellently.

Furthermore, the cleaning member 3 is configured to engage with the spin chuck 11 and rotate (spin) together with the spin chuck 11 only at the time of cleaning the cup structure 2. Since the cleaning member 3 does not rotate at the time of the liquid treatment of the wafer W, air flow disturbance can be prevented and the resist solution application process can be conducted with high in-plane uniformity. In the case where the cleaning member 3 is configured to engage with the spin chuck 11 and rotate together with the spin chuck 11, it becomes unnecessary to arrange a rotating mechanism exclusively for the cleaning member 3. Moreover, since both the cleaning liquid for the wafer back surface cleaning and the cleaning liquid for the cup structure cleaning are supplied through the same cleaning nozzles 8, the structure of the apparatus is simplified compared to cases where cup cleaning nozzles and substrate cleaning nozzles are arranged separately.

Figure 8:
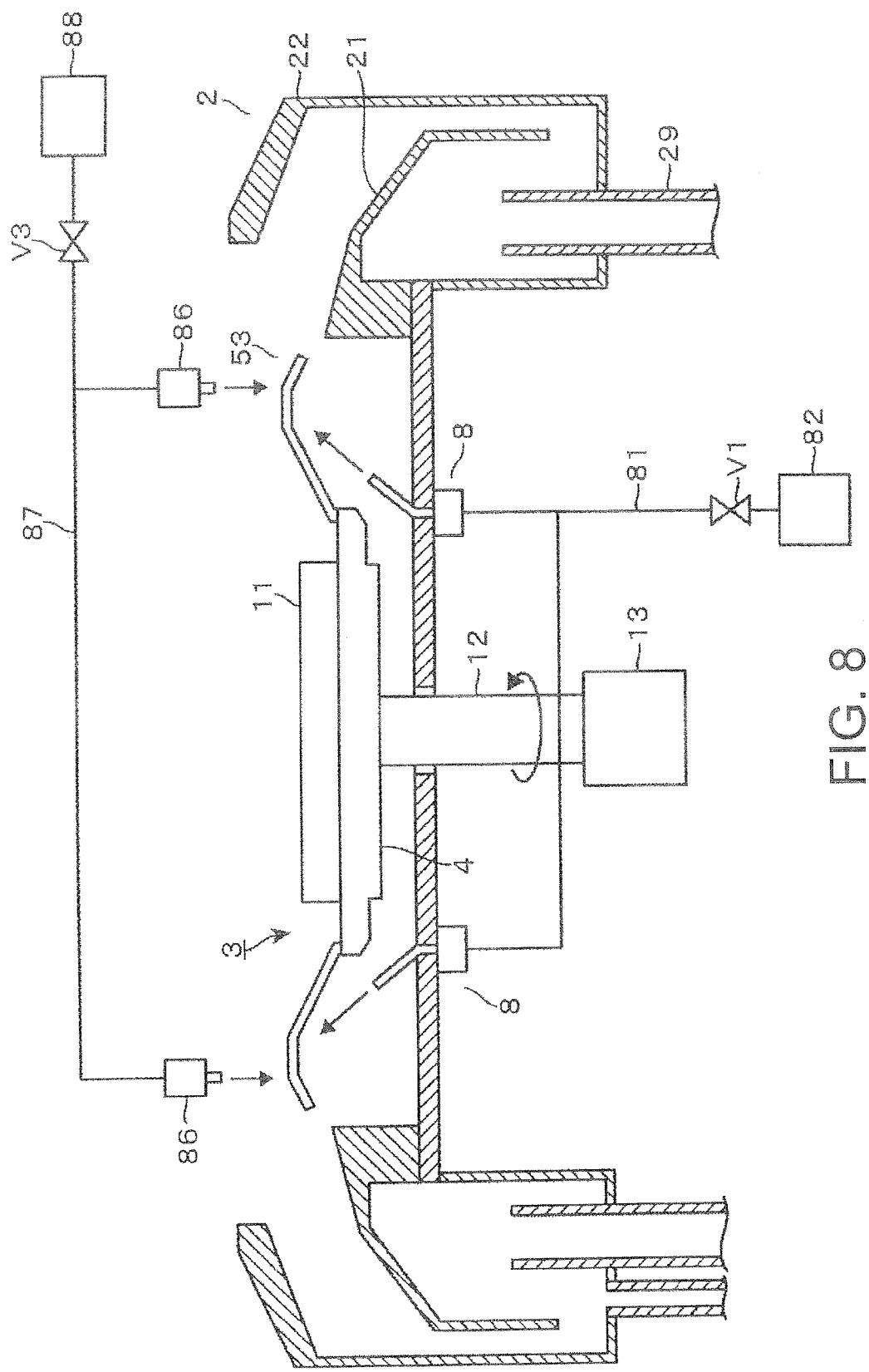
FIG. 8 is a vertical sectional side view showing a modification of the liquid treatment apparatus in the first embodiment.

A modification (modified example) of the first embodiment will be described below referring to FIG. 8. This modification differs from the liquid treatment apparatus 1 in the above-described first embodiment in that the former is further equipped with cup cleaning nozzles 86 for supplying the cleaning liquid to the surface of the annular part 5 of the cleaning member 3. For example, a plurality of cup cleaning nozzles 86 are prepared and arranged on a concentric circle (having the shaft part 12 as the center) at appropriate intervals in the circumferential direction. These cup cleaning nozzles 86 are connected to a cleaning liquid supply source 88 via supply lines 87 equipped with a valve V3. An annular part 53 in this modification is configured to have an inclined surface which descends toward its outer edge. The other configuration is equivalent to that in the first embodiment.

In this configuration, in the cleaning of the cup structure 2, the cleaning liquid is discharged from the cleaning nozzles 8 toward the back surface of the annular part 53 while also discharging the cleaning liquid from the cup cleaning nozzles 86 toward the surface (front side) of the annular part 53 to make the cleaning liquid collide with the surface. The cleaning liquid colliding with the back surface and the front side of the annular part 53 is scattered in different directions by the centrifugal force of the spinning of the annular part 53. Thus, the cleaning liquid can be supplied to various parts inside the cup structure 2 and the cleaning effect can be enhanced. Further, by providing the annular part 53 with the inclined surface, the mode of scattering of the cleaning liquid is changed from that achieved with the horizontal annular part. Thus, the cleaning liquid can be supplied in a mode suitable for the shape of the cup structure 2 through adjustment of the inclined surface. Consequently, the cleaning can be carried out excellently.

Figure 9:
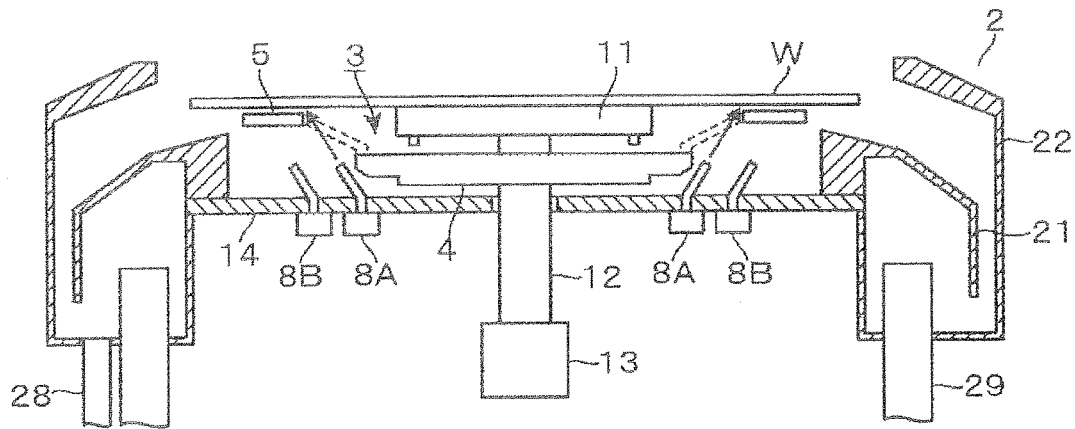
FIG. 9 is a vertical sectional side view showing another modification of the liquid treatment apparatus in the first embodiment.
Figure 10:
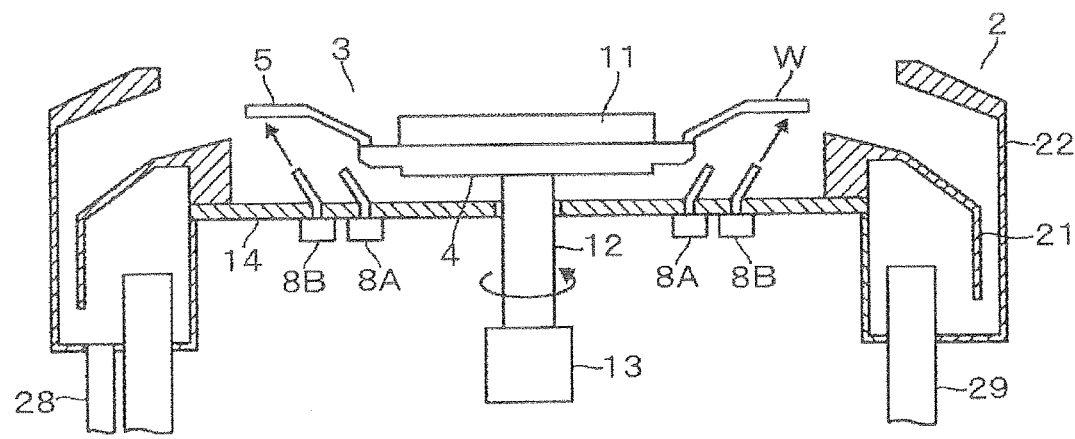
FIG. 10 is a vertical sectional side view showing another modification of the liquid treatment apparatus in the first embodiment.

Another modification of the first embodiment will be described below referring to FIGS. 9 and 10. This modification differs from the liquid treatment apparatus 1 in the above-described first embodiment in that, in the former, substrate cleaning nozzles 8A for the wafer back surface cleaning and cup cleaning nozzles 8B for the cup structure cleaning are arranged separately. The substrate cleaning nozzles 8A and the cup cleaning nozzles 8B are configured similarly to the cleaning nozzles 8 in the first embodiment, for example. The substrate cleaning nozzles 8A are arranged at positions closer to the shaft part 12 than the cup cleaning nozzles 8B. For example, a plurality of substrate cleaning nozzles 8A and cup cleaning nozzles 8B are prepared and arranged on concentric circles (differing in the diameter and having the shaft part 12 as their center) at appropriate intervals in the circumferential direction. The other configuration is equivalent to that in the first embodiment.

In this configuration, nozzles having shapes suitable for the wafer back surface cleaning (see FIG. 9) and nozzles having shapes suitable for the cup structure cleaning (see FIG. 10) can be arranged respectively at appropriate positions. Since it is possible to supply the cleaning liquid to the peripheral area of the back surface of the wafer W and also to supply the cleaning liquid to make it consistently collide with the annular part 5, the back surface cleaning of the wafers W and the cleaning of the cup structure 2 can be carried out excellently.

Still another modification of the first embodiment will be described below referring to FIG. 11. This modification differs from the liquid treatment apparatus 1 in the above-described first embodiment in that the former is equipped with a moving mechanism for moving the positions of the discharge ports of the cleaning nozzles between positions for the back surface cleaning of the wafers W and positions for the cleaning of the cup structure 2. Cleaning nozzles 800 in this modification are nozzles serving as both the substrate cleaning nozzles and the cup cleaning nozzles. The cleaning nozzles 800 are configured to be freely moved by a drive mechanism 802 on guide rails 801 arranged horizontally in radial directions of the cup structure 2. The aforementioned moving mechanism includes, for instance, the drive mechanism 802 and the guide rails 801. For example, a plurality of cleaning nozzles 800 are prepared and arranged on a circle centering at the shaft part 12 at appropriate intervals in the circumferential direction. The other configuration is equivalent to that in the first embodiment.

Figure 11:
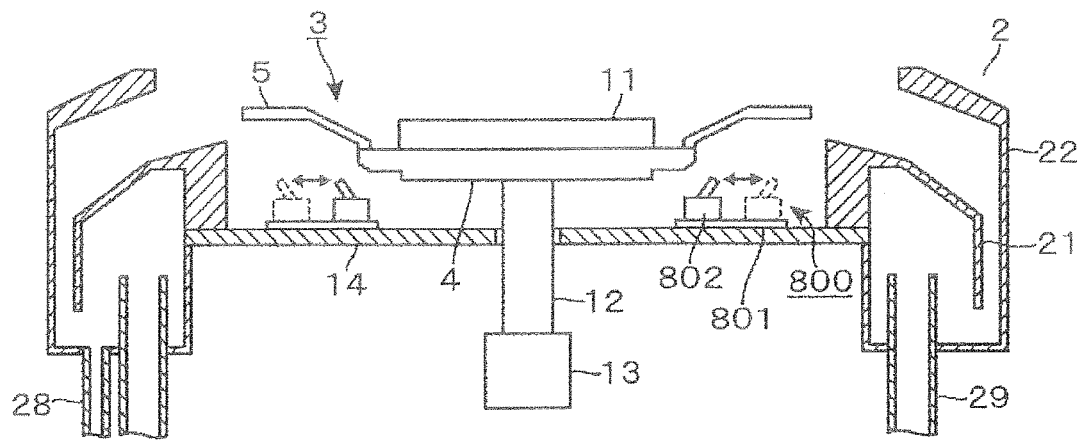
FIG. 11 is a vertical sectional side view showing another modification of the liquid treatment apparatus in the first embodiment.

In this configuration, each cleaning nozzle 800 moves between a wafer back surface cleaning position (indicated with solid lines in FIG. 11) and a cup structure cleaning position (indicated with dotted lines in FIG. 11). Since it is possible to supply the cleaning liquid to the peripheral area of the back surface of the wafer W and also to supply the cleaning liquid to make it consistently collide with the annular part 5, the back surface cleaning of the wafers W and the cleaning of the cup structure 2 can be carried out excellently.

Still another modification of the first embodiment will be described below referring to FIGS. 12 and 13. This modification differs from the liquid treatment apparatus 1 in the above-described first embodiment in that the former is equipped with a moving mechanism for moving the positions of the discharge ports of the cleaning nozzles in the vertical direction. Cleaning nozzles 810 in this modification are nozzles serving as both the substrate cleaning nozzles and the cup cleaning nozzles. Nozzle parts 811 are configured to be freely elevated (moved up and down) by elevation mechanisms 812 constituting the moving mechanism. In this modification, the elevation mechanisms 812 correspond to the aforementioned elevation mechanism for elevating (moving up and down) the cleaning member 3 relative to the substrate cleaning nozzles and the cup cleaning nozzles between the first position and the second position higher than the first position. A plurality of cleaning nozzles 810 are prepared and arranged on a circle centering at the shaft part 12 at appropriate intervals in the circumferential direction, for example. The other configuration is equivalent to that in the first embodiment except that the cleaning member 3 is not equipped with the elevation mechanism 71.

Figure 12:
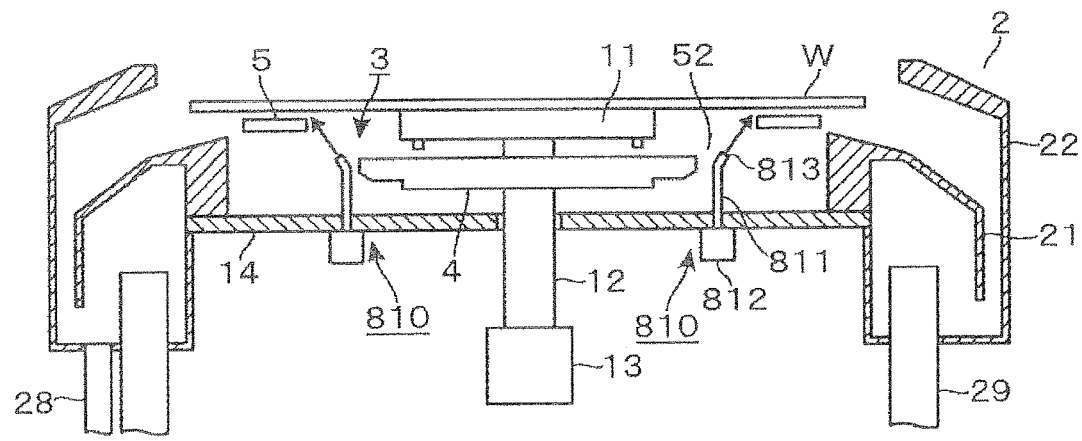
FIG. 12 is a vertical sectional side view showing another modification of the liquid treatment apparatus in the first embodiment.
Figure 13:
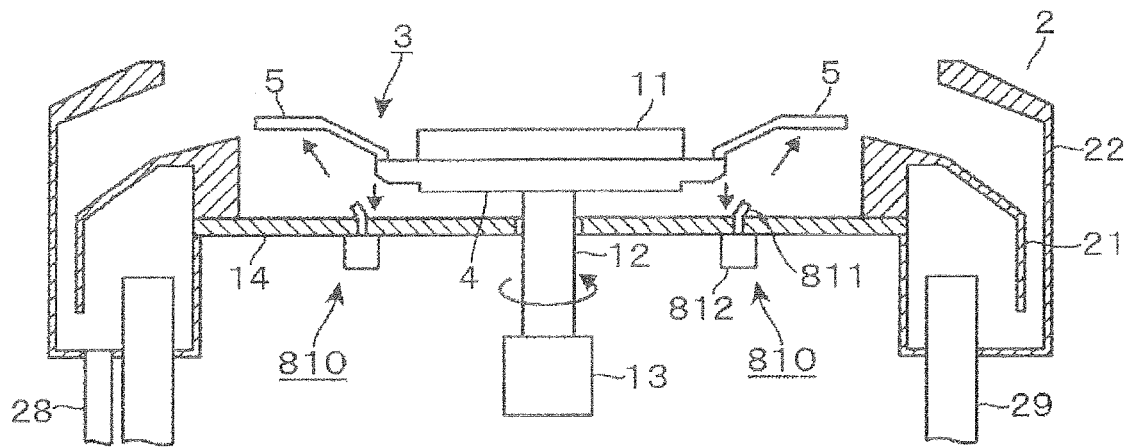
FIG. 13 is a vertical sectional side view showing another modification of the liquid treatment apparatus in the first embodiment.

In this configuration, when the back surface of the wafer W is cleaned as shown in FIG. 12, the nozzle parts 811 are elevated and the cleaning liquid discharged from discharge ports 813 at the tip ends of the nozzle parts 811 is allowed to reach the back surface of the wafer W via the openings 52 of the cleaning member 3. The discharge ports 813 of the nozzle parts 811 are positioned close to the cleaning member 3. The height position of the cleaning member 3 at this time is the first position. In contrast, when the cup structure 2 is cleaned as shown in FIG. 13, the spin chuck 11 is lowered and engaged with the cleaning member 3, and the nozzle parts 811 are lowered to make the cleaning liquid from the nozzle parts 811 collide with the annular part 5 of the cleaning member 3. Since the cleaning member 3 is supported by the support member 7 via the bearing 6 to be freely rotatable around the vertical axis, the cleaning member 3 engaged with the spin chuck 11 spins along with the spinning of the spin chuck 11. By the lowering of the nozzle parts 811, the discharge ports 813 of the nozzle parts 811 separate from the cleaning member 3. The height position of the cleaning member 3 at this time is the second position. Thus, in view from the discharge port 813 of each nozzle part, the second position is higher than the first position. Also in this modification, it is possible to supply the cleaning liquid to the peripheral area of the back surface of the wafer W and also to supply the cleaning liquid to make it consistently collide with the annular part 5. Therefore, the back surface cleaning of the wafers W and the cleaning of the cup structure 2 can be carried out excellently.

Still another modification of the first embodiment will be described below referring to FIGS. 14 and 15. This modification differs from the liquid treatment apparatus 1 in the above-described first embodiment in that the former is equipped with a moving mechanism for moving (rotating) the position of the discharge port of each cleaning nozzle around a horizontal axis. Cleaning nozzles 820 in this modification are nozzles serving as both the substrate cleaning nozzles and the cup cleaning nozzles. Each cleaning nozzle 820 is configured so that the angle of its nozzle part 824 (with respect to the horizontal plane) can be changed by a drive motor 822 which rotates a nozzle body 821 of the cleaning nozzle 820 via a horizontal rotating shaft 823, for example. The aforementioned moving mechanism is made up of the drive motors 822 and the rotating shafts 823. With the change in the angle of the nozzle part 824, the discharging angle of the cleaning liquid (i.e., the angle between the horizontal axis and the discharging direction of the cleaning liquid) changes. A plurality of cleaning nozzles 820 are prepared and arranged on a circle centering at the shaft part 12 at appropriate intervals in the circumferential direction, for example. The other configuration is equivalent to that in the first embodiment.

Figure 14:
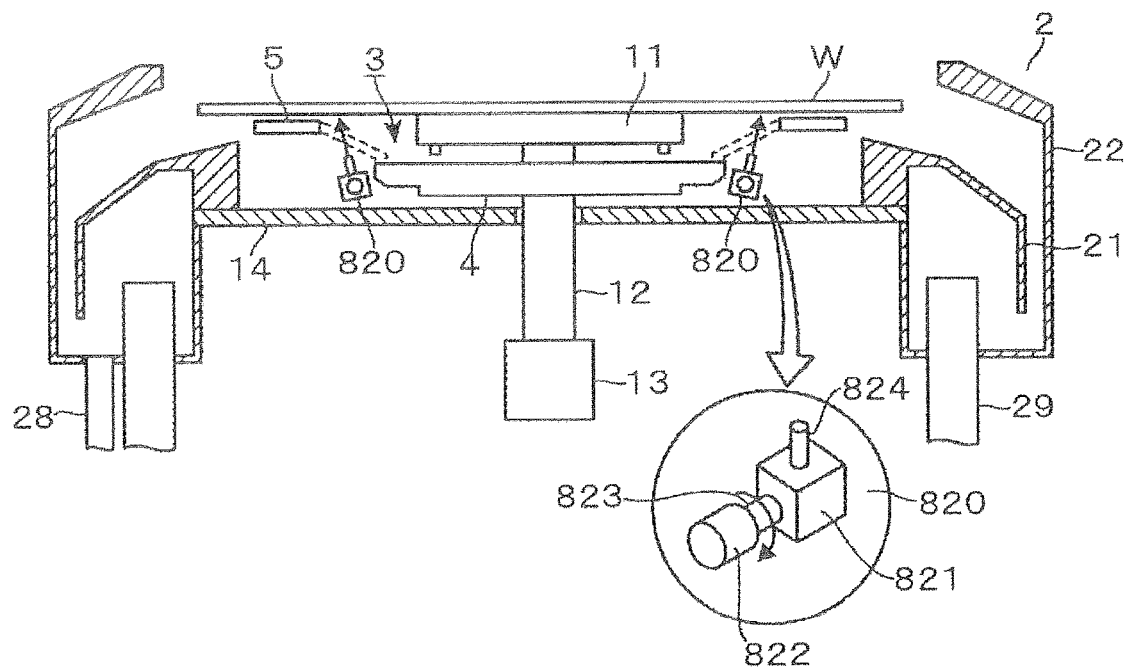
FIG. 14 is a vertical sectional side view showing another modification of the liquid treatment apparatus in the first embodiment.
Figure 15:
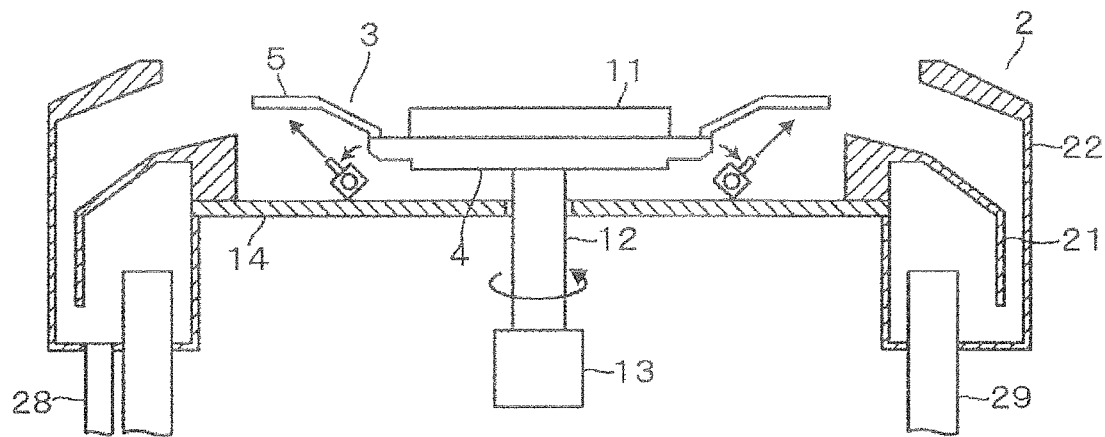
FIG. 15 is a vertical sectional side view showing another modification of the liquid treatment apparatus in the first embodiment.

In this configuration, the discharging angle of the cleaning liquid is changed between the wafer back surface cleaning shown in FIG. 14 and the cup structure cleaning shown in FIG. 15, by changing the angle of the nozzle part 824 of each cleaning nozzle 820. Since it is possible to supply the cleaning liquid to the peripheral area of the back surface of the wafer W and also to supply the cleaning liquid to make it consistently collide with the annular part 5, the back surface cleaning of the wafers W and the cleaning of the cup structure 2 can be carried out excellently.

Figure 16:
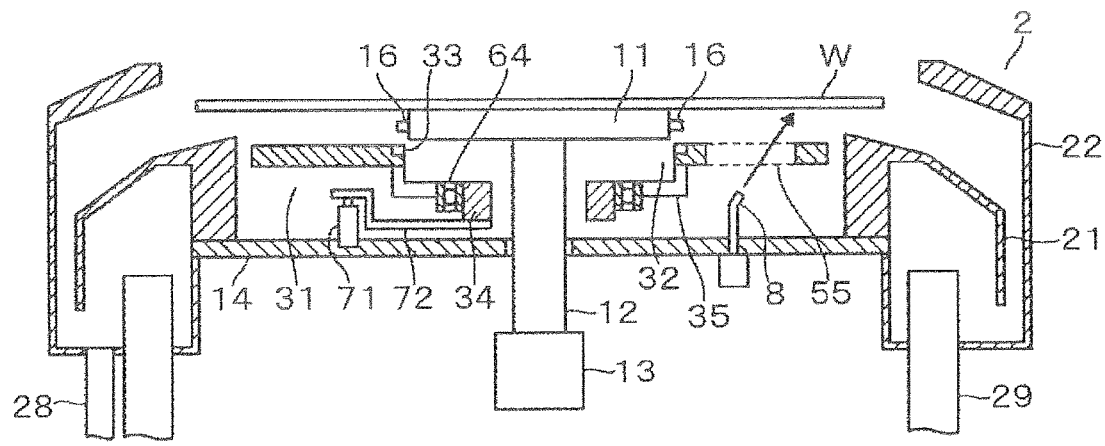
FIG. 16 is a vertical sectional side view showing another modification of the liquid treatment apparatus in the first embodiment.
Figure 17:
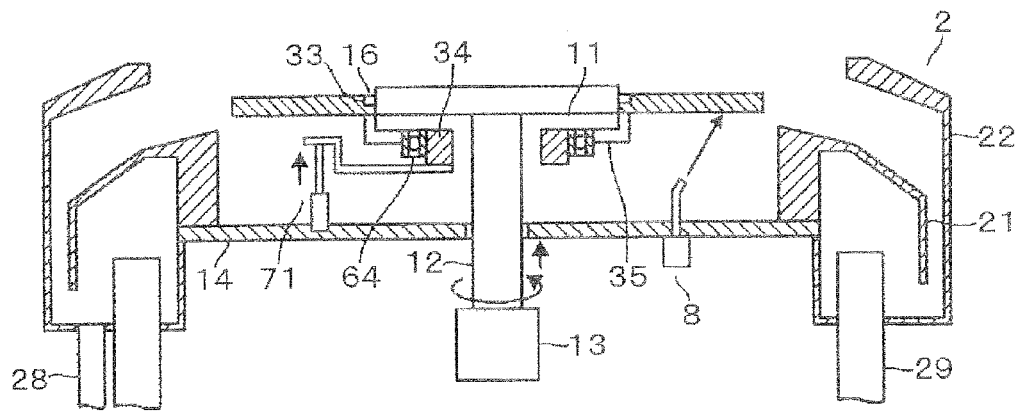
FIG. 17 is a vertical sectional side view showing another modification of the liquid treatment apparatus in the first embodiment.
Figure 18:
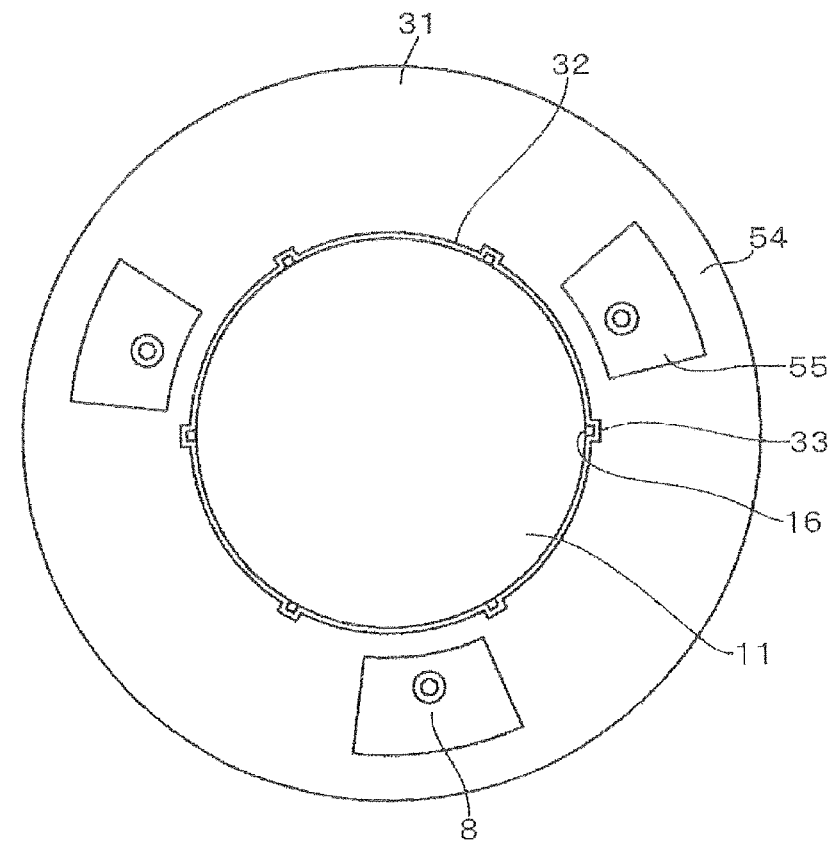
FIG. 18 is a plan view showing another modification of the liquid treatment apparatus in the first embodiment.

Still another modification of the first embodiment will be described below referring to FIGS. 16-18. In this modification, the cleaning member 31 is configured to engage with the side face of the spin chuck 11. The cleaning member 31 is formed in an annular shape in the plan view, for example. An opening area 32 corresponding to the spin chuck 11 is formed at the center of the cleaning member 31. The peripheral area of the cleaning member 31 corresponds to an annular part 54. The cleaning member 31 has openings 55 situated inside the annular part 54 in regard to the radial direction of the cup structure 2.

The side face of the spin chuck 11 is provided with convex parts 16. On the other hand, concave parts 33 for engaging with the convex parts 16 are formed on the inner surface of the opening area 32 of the cleaning member 31. The convex parts 16 and the concave parts 33 are configured to engage (or mate) with each other when the cleaning member 3 is elevated from the first position to the second position. Incidentally, the gap between each convex part 16 and the corresponding concave part 33 is exaggerated in FIG. 18.

The cleaning member 31 is supported via a bearing 64 (e.g., ball bearing) by a support member 34 (in a cylindrical shape, for example) which is arranged to surround the shaft part 12. The inner ring of the bearing 64 is connected to the support member 34, while the outer ring of the bearing 64 is connected to an annular holding member 35, for example. The other edge of the holding member 35 is connected to the cleaning member 3. Thus, the cleaning member 31 is constantly supported around the vertical axis. The lower surface of the support member 34 is connected to the elevation mechanism 71 via the elevation plate 72 similarly to the first embodiment. The cleaning member 3 is moved up and down between the first position (see FIG. 16) and the second position (see FIG. 17). When the cleaning member 3 is set at the second position, the cleaning liquid colliding with the annular part 54 of the cleaning member 3 has to be scattered around and guided to the inside of the cup structure 2. For this purpose, the height positions of the cleaning member 31 and the spin chuck 11 are adjusted so that the opening area between the inner cup 21 and the outer cup 22 of the cup structure 2 is situated lateral to the cleaning member 3, for example. The other configuration is equivalent to that in the first embodiment.

In this configuration, for the wafer back surface cleaning, the cleaning member 31 is set at the first position, the openings 55 are set at positions corresponding to the cleaning nozzles 8, and the cleaning liquid from the cleaning nozzles 8 is supplied to the back surface of the wafer W via the openings 55. For the cup structure cleaning, the cleaning member 31 is set at the second height position and engaged with the spin chuck 11, and the height positions of the spin chuck 11 and the cleaning member 31 are adjusted so that the cup structure 2 is situated lateral to the cleaning member 31. Then, the cleaning member 31 is spun by the spinning of the spin chuck 11. The cleaning of the cup structure 2 is conducted by making the cleaning liquid from the cleaning nozzles 8 collide with the annular part 54 and be guided to the inner surfaces of the cup structure 2.

Also in this configuration, in the wafer back surface cleaning, the cleaning liquid is directly supplied to the circumferential part of the back surface of the wafer W via the openings 55 of the cleaning member 31. Therefore, the resist adhering to the back surface of the wafer W is removed quickly. In the cup structure cleaning, the cleaning liquid is made to collide with the annular part 54 (peripheral area of the cleaning member 31) to be scattered and guided to the inside of the cup structure 2. Therefore, the scattered cleaning liquid reaches large areas inside the cup structure 2 and the resist adhering to the cup structure 2 is removed quickly.

In the configurations described above, the cleaning member 3 may also be configured to be freely rotated (spun) around the vertical axis by a rotation mechanism provided separately from the drive unit 13 of the spin chuck 11. The connection of the cleaning member 3, 31 and the spin chuck 11 may also be made by using an electromagnet, for example. For instance, the electromagnet may be arranged on the cleaning member's side. When the cleaning member 3, 31 is set at the second position, the electromagnet is turned on to attach the cleaning member 3, 31 to the spin chuck 11 (i.e., electromagnetic engagement between the cleaning member 3, 31 and the spin chuck 11 is established) and then the cleaning member 3, 31 is spun together with the spin chuck 11. When the cleaning member 3, 31 is set at the first position, the electromagnet is turned off to make the cleaning member 3, 31 separate from the spin chuck 11. The above-described first embodiment may also be configured by employing some of the above modifications in combination. The annular part 5, 54 may also be formed to have an ascending inclined surface. The inclined surface may be formed either by inclining the annular part 5, 54 itself to ascend or descend toward its outer edge or by inclining an outer part of the annular part 5, 54 in regard to the radial direction of the cup structure 2.

Second Embodiment

Next, a second embodiment of the liquid treatment apparatus according to the present invention will be described below referring to FIGS. 19 and 20. A liquid treatment apparatus 9 in this embodiment differs from the liquid treatment apparatus 1 of the first embodiment in that a cleaning member 91 is attached to the spin chuck 11. The spin chuck (substrate holding part) 11 and the cup structure 2 in this embodiment are configured in the same way as those in the first embodiment. In the second embodiment, components/parts equivalent to those in the first embodiment are assigned the already used reference characters and repeated explanation thereof is omitted for brevity.

Figure 19:
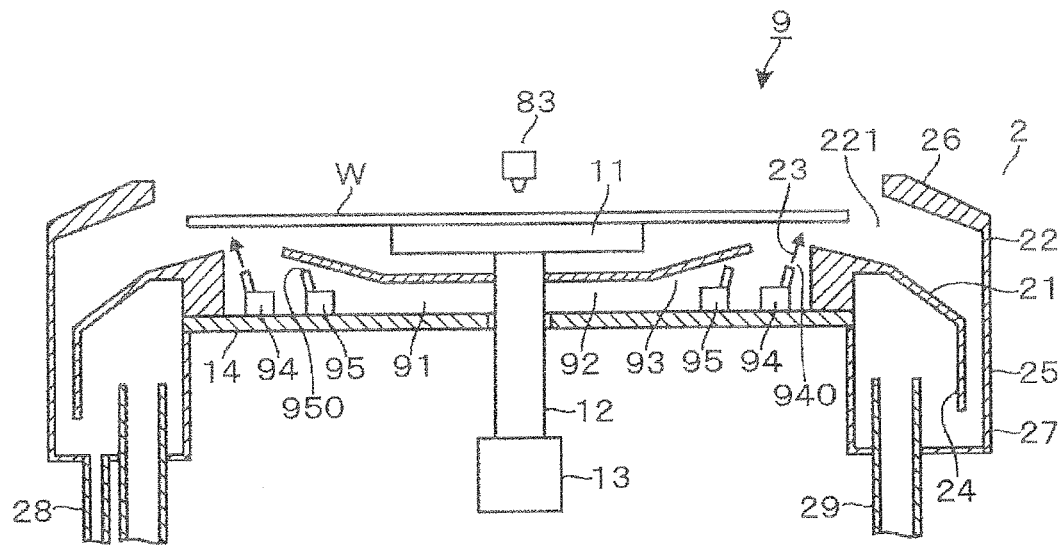
FIG. 19 is a vertical sectional side view showing a liquid treatment apparatus in a second embodiment of the present invention.
Figure 20:
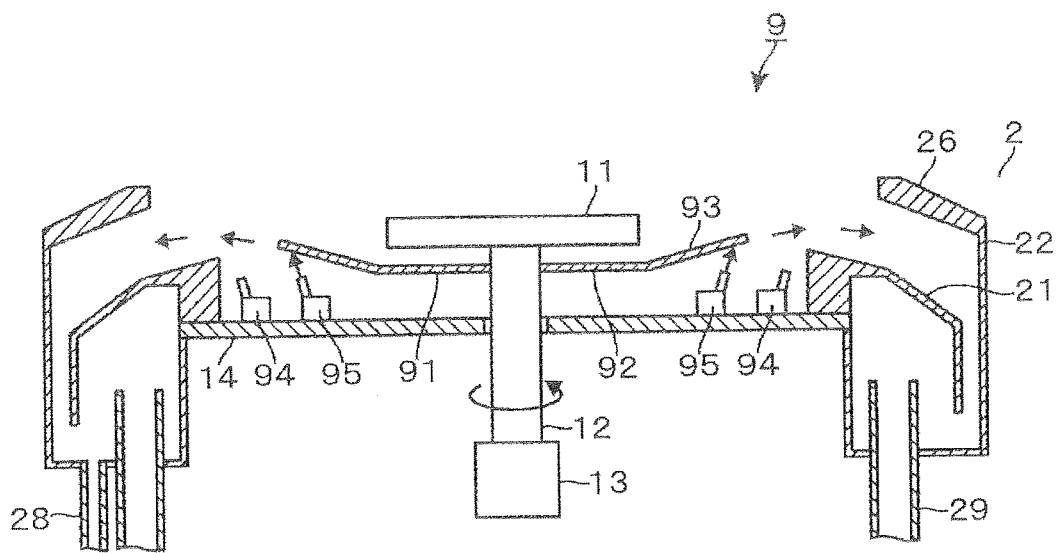
FIG. 20 is a vertical sectional side view showing the liquid treatment apparatus in the second embodiment.

Between the spin chuck 11 and the circular plate 14, the cleaning member 91 is arranged by fixing it to the shaft part 12 (rotating shaft) as shown in FIGS. 19 and 20. The cleaning member 91 is formed in a circular shape (in the plan view) centering at the rotational center of the shaft part 12, for example. The cleaning member 91 includes a face part 92 facing the back surface of the spin chuck 11 and a sloped face part 93 ascending outward from the face part 92, for example. The sloped face part 93 has the function of making the cleaning liquid for the cup structure cleaning collide therewith and guiding the cleaning liquid to the inside of the cup structure 2 as will be explained later. The cleaning member 91 is formed to have a smaller diameter than the wafer W held by the spin chuck 11, and thus the outer edge of the cleaning member 91 is situated inside the outer edge of the wafer W held by the spin chuck 11 in regard to the radial direction of the cup structure 2.

Under the cleaning member 91, a plurality of substrate cleaning nozzles 94 for supplying the cleaning liquid for the wafer back surface cleaning are arranged around the shaft part 12 at appropriate intervals in the circumferential direction. The discharge port 940 of each substrate cleaning nozzle 94 is configured so that the discharging direction of the cleaning liquid points obliquely upward and outward in the radial direction of the cup structure 2. The substrate cleaning nozzles 94 are configured to allow the cleaning liquid to reach the peripheral area of the back surface of the wafer W via paths outside the peripheral edge of the cleaning member 91 when the back surface of the wafer W held on the spin chuck 11 is cleaned. In the illustrated embodiment, three substrate cleaning nozzles 94 are arranged at positions equally trisecting the circumference of a first concentric circle having the shaft part 12 as the rotational center. The cleaning liquid is supplied from each substrate cleaning nozzle 94 to a position on the back surface of the wafer W that is 30 mm inside the outer circumference of the wafer W, for example.

Further, a plurality of cup cleaning nozzles 95 for supplying the cleaning liquid for the cup structure cleaning are arranged around the shaft part 12 at appropriate intervals in the circumferential direction. The discharge port 950 of each cup cleaning nozzles 95 is configured so that the discharging direction of the cleaning liquid points obliquely upward and outward in the radial direction of the cup structure 2. The cup cleaning nozzles 95 are configured so as to make the cleaning liquid collide with the sloped face part 93 of the cleaning member 91 when the cup structure 2 is cleaned. In the illustrated embodiment, three cup cleaning nozzles 95 are arranged at positions equally trisecting the circumference of a second concentric circle having the shaft part 12 as the rotational center and having a smaller diameter than the first concentric circle, for example. A solvent capable of dissolving the resist is used as the cleaning liquid, for example. The substrate cleaning nozzles 94 and the cup cleaning nozzles 95 are connected to a cleaning liquid supply source via supply lines (not shown).

The liquid treatment apparatus 9 is further equipped with a resist nozzle 83. The resist nozzle 83 is connected to a resist supply source via a supply line (not shown). The resist nozzle 83 is configured to be movable by a nozzle moving mechanism (not shown) between a treatment position over the wafer W and a standby position lateral to the cup structure 2.

The operation of each part of the liquid treatment apparatus 9 is controlled by a control unit. The control unit includes a program storage unit, a CPU and a memory. The program storage unit includes one or more computer storage media such as a flexible disk, a compact disk, a hard disk, an MO (magneto-optical disk) and a memory card. A program stored in such a storage medium is installed in the control unit. The program includes commands (steps) for controlling the operation of each part of the liquid treatment apparatus 9 (by transmitting control signals thereto) and executing the resist solution application process (resist film formation process) which will be explained later, the wafer back surface cleaning process, and the cup structure cleaning process.

Next, the operation of the above-described liquid treatment apparatus 9 will be explained below. First, a wafer W is conveyed onto the spin chuck 11 and handed over to the spin chuck 11 by using a conveyance arm (not shown). Since the opening 221 of the outer cup 22 of the cup structure 2 is larger than the wafer W in the illustrated embodiment, the spin chuck 11 is elevated to a position higher than the outer cup 22, the wafer W is handed over from the conveyance arm to the spin chuck 11 at this position, and the wafer W is sucked and held by the spin chuck 11, for example. Then, the resist solution application process (resist film formation process) is executed. In this application process, the resist nozzle 83 is moved to the aforementioned treatment position, the wafer W is spun at a prescribed revolution speed (e.g., 3000 rpm), and the resist solution is supplied from the resist nozzle 83 to the central part of the wafer W. The resist solution is spread toward the periphery of the wafer W by the centrifugal force and supplied to the entire surface of the wafer W. The spinning of the wafer W is continued for a prescribed period. The solvent contained in the resist solution on the surface of the wafer W volatilizes, by which a resist film is formed. Unnecessary resist solution is scattered outward from the wafer W by the centrifugal force. The scattered resist solution flows, for example, from the region between the inner cup 21 and the outer cup 22 to the drainage line 28 via the liquid receiving part 27 and is drained. Part of the resist solution adheres to the ridge-shaped guide part 23 and the vertical wall 24 of the inner cup 21 and to the inner surfaces of the outer cup 22 and the liquid receiving part 27 and accumulates on the surfaces.

After the resist film formation process is finished, the wafer back surface cleaning process is executed as shown in FIG. 19. In the back surface cleaning process, the wafer W is sucked and held by the spin chuck 11 and the cleaning liquid is discharged from the substrate cleaning nozzles 94 while spinning the spin chuck 11 at a prescribed revolution speed (e.g., 1000 rpm). The cleaning liquid is supplied to the peripheral area of the back surface of the wafer W via paths outside the cleaning member 91. Since each substrate cleaning nozzle 94 is configured so that the discharging direction of the cleaning liquid points obliquely upward and outward in the radial direction of the cup structure 2, the cleaning liquid discharged from the substrate cleaning nozzles 94 reach the peripheral area of the back surface of the wafer W (e.g., positions 30 mm inside the outer circumference of the wafer W).

Since the wafer W is spinning at this time, the cleaning liquid flows to spread outward due to the centrifugal force of the spinning, gets scattered outward by the centrifugal force, and is collected by the cup structure 2. Thanks to the spinning of the wafer W, the cleaning liquid evenly covers the circumferential part of the back surface of the wafer W and the resist solution adhering to the peripheral part of the back surface of the wafer W is dissolved and removed by the cleaning liquid. The resist solution scatters toward the cup structure 2 together with the cleaning liquid, flows to the liquid receiving part 27 via the region between the inner cup 21 and the outer cup 22, for example, and is drained via the drainage line 28.

After the supply of the cleaning liquid to the wafer W being spun is continued for a prescribed period, the supply of the cleaning liquid is stopped and the spinning of the wafer W is continued, by which the cleaning liquid remaining on the back surface of the wafer W is vaporized and removed. After continuing the spinning for the removal of the cleaning liquid for a prescribed period, the spinning of the spin chuck 11 is stopped, the spin chuck 11 is elevated to the handover position, and the wafer W is handed over to the conveyance arm (not shown).

After performing the resist solution application process and the wafer back surface cleaning process on all wafers W (included in a lot, for example), the cup structure cleaning process is executed. In this cleaning process, the cleaning liquid is discharged from the cup cleaning nozzles 95 while spinning the spin chuck 11 at a prescribed revolution speed (e.g., 1500 rpm). The cleaning liquid collides with the sloped face part 93 of the cleaning member 91, spreads outward due to the centrifugal force of the spinning while being guided by the sloped face part 93, and gets scattered outward from the cleaning member 91. The cleaning liquid is scattered widely and reaches large areas on the inner surface of the cup structure 2, such as the ridge-shaped guide part 23 and the vertical wall 24 of the inner cup 21 and the inner surfaces of the outer cup 22 and the liquid receiving part 27. The amount of the resist solution scattering from the wafer W in the resist solution application process is slight compared to the amount of the cleaning liquid scattering from the cleaning member 91 in the cup structure cleaning process. Further, the resist solution has higher viscosity than the cleaning liquid. Thus, the area on the cup structure 2 reached by the cleaning liquid in the cleaning process is larger than the resist-adhering area on the cup structure 2. Therefore, the cleaning liquid evenly reaches and covers the entire resist-adhering area on the cup structure 2. The resist dissolves in the cleaning liquid, flows into the liquid receiving part 27 together with the cleaning liquid, and is drained. After continuing the spinning of the cleaning member 91 and the supply of the cleaning liquid for a prescribed period, the supply of the cleaning liquid is stopped and the spinning of the cleaning member 91 is continued, by which the cleaning liquid remaining on the cleaning member 91 is vaporized and removed. After continuing the spinning for the removal of the cleaning liquid for a prescribed period, the spinning of the spin chuck 11 is stopped.

In this embodiment, the cleaning member 91 is attached to the shaft part 12 of the spin chuck 11. Therefore, the cleaning of the cup structure 2 can be conducted without the need of using a cleaning member 91 provided separately from the spin chuck 11. Since it is unnecessary to convey the cleaning member 91 by using the conveyance mechanism (conveyance arm), the conveyance mechanism can be used exclusively for the treatment of the wafers W and the deterioration in the conveyance throughput can be suppressed. Further, downsizing of the apparatus can be achieved since it is unnecessary to secure a storage room for storing the cleaning member 91 in the apparatus. Furthermore, since the substrate cleaning nozzles 94 are arranged below the cleaning member 91, the degrees of freedom of the shapes and positions of arrangement of the substrate cleaning nozzles 94 are high, which makes it possible to appropriately design a liquid treatment apparatus capable of achieving greater cleaning effect. As a result, the back surface cleaning of the wafers W and the cleaning of the cup structure 2 can be carried out excellently. Moreover, since the cleaning member 91 is attached to the shaft part 12 of the spin chuck 11 so that the cleaning member 91 spins along with the spinning of the spin chuck 11, it becomes unnecessary to arrange a rotating mechanism exclusively for the cleaning member 91. As a result, the structure of the apparatus is simplified.

A modification of the second embodiment will be described below referring to FIG. 21. This modification differs from the liquid treatment apparatus 1 in the above-described second embodiment in that the former is further equipped with cleaning nozzles 900 for serving as both the substrate cleaning nozzles 94 and the cup cleaning nozzles 95 and a moving mechanism for moving the positions of the discharge ports 901 of the cleaning nozzles 900 between the positions for the back surface cleaning of the wafers W and the positions for the cleaning of the cup structure 2. The cleaning nozzles 900 in this modification are configured to be freely moved by a drive mechanism 903 on guide rails 902 arranged horizontally in radial directions of the cup structure 2. The aforementioned moving mechanism includes, for instance, the drive mechanism 903 and the guide rails 902. For example, a plurality of cleaning nozzles 900 are prepared and arranged on a circle centering at the shaft part 12 at appropriate intervals in the circumferential direction. The other configuration is equivalent to that in the second embodiment.

Figure 21:
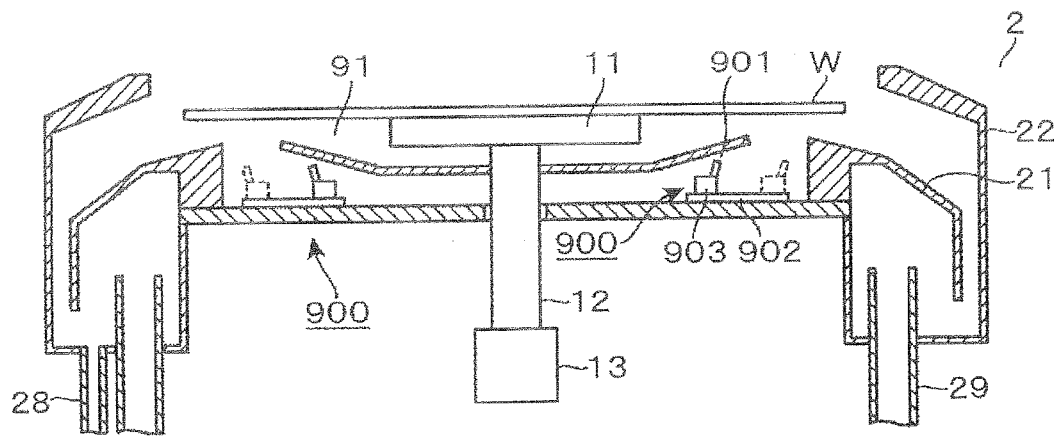
FIG. 21 is a vertical sectional side view showing one modification of the liquid treatment apparatus in the second embodiment.

In this configuration, each cleaning nozzle 900 moves between a wafer back surface cleaning position (indicated with dotted lines in FIG. 21) and a cup structure cleaning position (indicated with solid lines in FIG. 21). Since it is possible to supply the cleaning liquid to the peripheral area of the back surface of the wafer W and also to supply the cleaning liquid to make it consistently collide with the cleaning member 31, the back surface cleaning of the wafers W and the cleaning of the cup structure 2 can be carried out excellently.

The cleaning nozzles 900 may also be configured as vertical nozzles, for example. For cleaning the wafer back surface 2, the cleaning nozzles 900 are moved to positions facing the peripheral area of the back surface of the wafer W and the cleaning liquid is supplied to the back surface of the wafer W. In contrast, for the cup structure cleaning, the cleaning nozzles 900 are moved to positions facing the sloped face part 93 of the cleaning member 91 and then the cleaning liquid is supplied. The cleaning liquid supplied to the sloped face part 93 moves to the outer edge of the sloped face part 93 (due to the centrifugal force of the spinning) while being guided by the sloped face part 93, gets scattered outward from the sloped face part 93, and is guided to the inside of the cup structure 2. Thus, the cleaning of the cup structure 2 can be conducted successfully also in this example.

Figure 22:
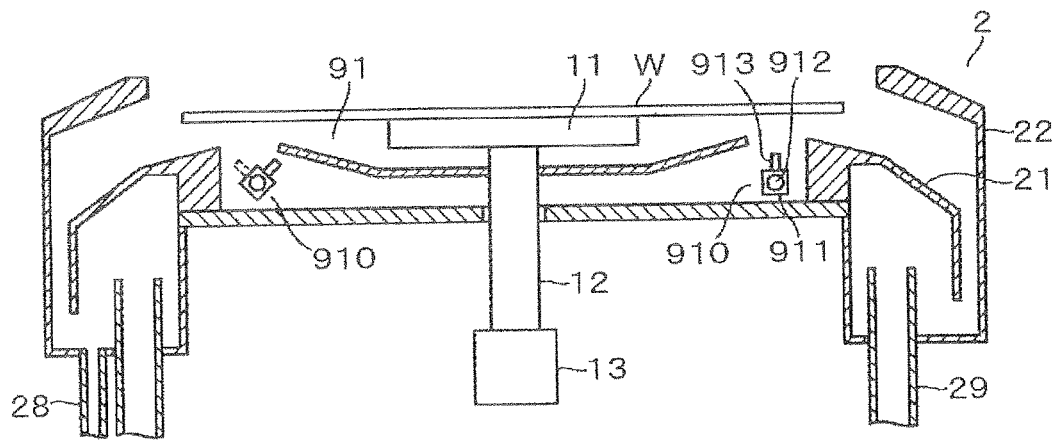
FIG. 22 is a vertical sectional side view showing another modification of the liquid treatment apparatus in the second embodiment.

Another modification of the second embodiment will be described below referring to FIG. 22. This modification differs from the liquid treatment apparatus 1 in the above-described second embodiment in that the former is further equipped with a moving mechanism for moving (rotating) the position of the discharge port of each cleaning nozzle around a horizontal axis. Cleaning nozzles 910 in this modification are nozzles serving as both the substrate cleaning nozzles and the cup cleaning nozzles. Each cleaning nozzle 910 is configured so that the angle of its nozzle part 913 (with respect to the horizontal plane) can be changed by a drive motor (not shown) which rotates a nozzle body 911 of the cleaning nozzle 910 via a horizontal rotating shaft 912, for example. The aforementioned moving mechanism is made up of the drive motors and the rotating shafts 912. With the change in the angle of the nozzle part 913, the discharging angle of the cleaning liquid (i.e., the angle between the horizontal axis and the discharging direction of the cleaning liquid) changes. A plurality of cleaning nozzles 910 are prepared and arranged on a circle centering at the shaft part 12 at appropriate intervals in the circumferential direction, for example. The other configuration is equivalent to that in the second embodiment.

In this configuration, the discharging angle of the cleaning liquid is changed between the wafer back surface cleaning and the cup structure cleaning, by changing the angle of the nozzle part 913 of each cleaning nozzle 910. Since it is possible to supply the cleaning liquid to the peripheral area of the back surface of the wafer W and also to supply the cleaning liquid to make it consistently collide with the annular part 5, the back surface cleaning of the wafers W and the cleaning of the cup structure 2 can be carried out excellently. Incidentally, the nozzle parts 913 of the cleaning nozzles 910 in FIG. 22 are illustrated at different angles in order to indicate the inclination (rotating function) of the cleaning nozzles 910.

Also in the liquid treatment apparatus in the second embodiment, it is possible to employ the aforementioned cup cleaning nozzles for supplying the cleaning liquid to the front side of the cleaning member 91. Further, the sloped face part 93 of the cleaning member 91 may also be configured to descend toward its outer edge. It is also possible to employ some of the above-described modifications in combination.

The liquid treatment performed by the liquid treatment apparatus is not limited to the liquid treatment for forming a resist film using a resist solution as described above, but may also be a liquid treatment using a chemical liquid for forming an antireflection film, an insulation film, etc.

What is claimed is:

1. A liquid treatment apparatus comprising:
   a substrate holding part having a circular shape and holding a substrate horizontally;
   a cup structure arranged around the substrate holding part;
   a rotating mechanism that rotates the substrate holding part to rotate the substrate held by the substrate holding part about a vertical axis;
   a treatment liquid nozzle that supplies a treatment liquid to a front surface of the substrate held by the substrate holding part;
   a cleaning liquid discharging arrangement that discharges a cleaning liquid for cleaning the cup structure and for cleaning a back surface of the substrate held by the substrate holding part, the cleaning liquid discharging arrangement having at least one nozzle;
   a cleaning member including an annular part formed in an annular shape extending along a circumferential direction of the cup structure and an opening positioned inside the annular part with respect to the radial direction of the cup structure;
   a support member connected to the cleaning member via a bearing such that the cleaning member is supported by the support member for free rotation relative to the support member about the vertical axis;
   an elevation mechanism that moves the support member up and down to move the cleaning member supported by the support member between a first position and a second position higher than the first position; and
   an engagement mechanism that engages the substrate holding part with the cleaning member at the second position so as to transmit rotational torque to the cleaning member such that the cleaning member rotates conjointly with the substrate holding part driven by the rotating mechanism,
   wherein the cleaning member positioned at the first position allows the cleaning liquid for cleaning the back surface of the substrate held by the substrate holding part discharged from the cleaning liquid discharging arrangement to reach the back surface of the substrate through the opening of the cleaning member, and the cleaning member positioned at the second position allows the cleaning liquid for cleaning the cup structure discharged from the cleaning liquid discharging arrangement to collide with the annular part of the cleaning member and to be guided to an inner surface of the cup structure.

2. The liquid treatment apparatus according to claim 1, wherein the engagement mechanism includes concave parts and convex parts, provided in the cleaning member and the substrate holding part, which mate with each other when the cleaning member is positioned at the second position.

3. The liquid treatment apparatus according to claim 1, wherein the annular part has an inclined surface ascending or descending toward its outer edge.

4. The liquid treatment apparatus according to claim 1, wherein the cleaning liquid discharging arrangement includes:
   a substrate cleaning nozzle that discharges the cleaning liquid for cleaning the back surface of the substrate held by the substrate holding part; and
   a cup cleaning nozzle that discharges the cleaning liquid for cleaning the cup structure,
   wherein the cleaning member positioned at the first position allows the cleaning liquid discharged from the substrate cleaning nozzle to reach the back surface of the substrate through the opening of the cleaning member, and the cleaning member positioned at the second position allows the cleaning liquid discharged from the cup cleaning nozzle to collide with the annular part of the cleaning member and to be guided to the inner surface of the cup structure.

5. The liquid treatment apparatus according to claim 1, wherein:
   the cleaning liquid discharging arrangement includes a common nozzle that discharges the cleaning liquid both for cleaning the cup structure and for cleaning the back surface of the substrate held by the substrate holding part; and
   the cleaning member positioned at the first position allows the cleaning liquid discharged from the common nozzle to reach the back surface of the substrate through the opening of the cleaning member, and the cleaning member positioned at the second position allows the cleaning liquid discharged from the common nozzle to collide with the annular part of the cleaning member and to be guided to the inner surface of the cup structure.

6. A liquid treatment apparatus comprising:
   a substrate holding part having a circular shape and holding a substrate horizontally;
   a cup structure arranged around the substrate holding part;
   a rotating mechanism that rotates the substrate holding part to rotate the substrate held by the substrate holding part about a vertical axis;
   a treatment liquid nozzle that supplies a treatment liquid to a front surface of the substrate held by the substrate holding part;
   a cleaning liquid discharging arrangement that discharges a cleaning liquid for cleaning the cup structure and for cleaning a back surface of the substrate held by the substrate holding part, the cleaning liquid discharging arrangement having at least one nozzle;
   a cleaning member including an annular part formed in an annular shape extending along a circumferential direction of the cup structure and an opening positioned inside the annular part with respect to the radial direction of the cup structure;

a support member connected to the cleaning member via a bearing such that the cleaning member is supported by the support member for free rotation relative to the support member about the vertical axis;

an elevation mechanism that moves the support member up and down to move the cleaning member supported by the support member between a first height position and a second height position higher than the first position; and an engagement mechanism that engages the substrate holding part with the cleaning member at the second position so as to transmit rotational torque to the cleaning member such that the cleaning member rotates conjointly with the substrate holding part driven by the rotating mechanism, wherein the cleaning member positioned at the first position allows the cleaning liquid for cleaning the back surface of the substrate held by the substrate holding part discharged from the cleaning liquid discharging arrangement to reach the back surface of the substrate through the opening of the cleaning member, and the cleaning member positioned at the second position allows the cleaning liquid for cleaning the cup structure discharged from the cleaning liquid discharging arrangement to collide with the annular part of the cleaning member and to be guided to an inner surface of the cup structure, and wherein the cleaning liquid discharging arrangement is disposed at so as to discharge the cleaning liquid for cleaning the substrate from a position lower than the cleaning member positioned at the first position, and the cleaning liquid discharging arrangement is configured to discharge the cleaning liquid obliquely upward and outward with respect to the radial direction of the cup structure.

7. The liquid treatment apparatus according to claim 6, wherein the cleaning liquid discharging arrangement includes:

a substrate cleaning nozzle that discharges the cleaning liquid for cleaning the back surface of the substrate held by the substrate holding part; and a cup cleaning nozzle that discharges the cleaning liquid for cleaning the cup structure, wherein the cleaning member positioned at the first position allows the cleaning liquid discharged from the substrate cleaning nozzle to reach the back surface of the substrate through the opening of the cleaning member, and the cleaning member positioned at the second position allows the cleaning liquid discharged from the cup cleaning nozzle to collide with the annular part of the cleaning member and to be guided to the inner surface of the cup structure.

8. The liquid treatment apparatus according to claim 6, wherein:

the cleaning liquid discharging arrangement includes a common nozzle that discharges the cleaning liquid both for cleaning the cup structure and for cleaning the back surface of the substrate held by the substrate holding part; and the cleaning member positioned at the first position allows the cleaning liquid discharged from the common nozzle to reach the back surface of the substrate through the opening of the cleaning member, and the cleaning member positioned at the second position allows the cleaning liquid discharged from the common nozzle to collide with the annular part of the cleaning member and to be guided to the inner surface of the cup structure.

9. A liquid treatment apparatus according to claim comprising:

a substrate holding part having a circular shape and holding a substrate horizontally;

a cup structure arranged around the substrate holding part;

a rotating mechanism that rotates the substrate holding part to rotate the substrate held by the substrate holding part about a vertical axis;

a treatment liquid nozzle that supplies a treatment liquid to a front surface of the substrate held by the substrate holding part;

a cleaning nozzle that discharges a cleaning liquid that can be used both for cleaning, the cup structure and for cleaning a back surface of the substrate held by the substrate holding part;

a cleaning member including an annular part formed in an annular shape extending along a circumferential direction of the cup structure and an opening positioned inside the annular part with respect to the radial direction of the cup structure;

a support member connected to the cleaning member via a hearing such that the cleaning member is supported by the support member for free rotation relative to the support member about the vertical axis;

an elevation mechanism that moves the support member up and down to move the cleaning member supported by the sue ort member between a first height position and a second height position; and an engagement mechanism that engages the substrate holding part with the cleaning member at the second position so as to transmit rotational torque to the cleaning member such that the cleaning member rotates conjointly with the substrate holding part driven by the rotating mechanism, wherein the cleaning member positioned at the first position allows the cleaning liquid discharged from the cleaning nozzle to reach the back surface of the substrate through the opening of the cleaning member, and the cleaning member positioned at the second position allows the cleaning liquid discharged from the cleaning nozzle to collide with the annular part of the cleaning member and to be guided to an inner surface of the cup structure.

* * * * *